(12) United States Patent
Aoyagi et al.

(10) Patent No.: US 10,048,427 B2
(45) Date of Patent: Aug. 14, 2018

(54) DISPLAY DEVICE, METHOD OF MANUFACTURING DISPLAY DEVICE, AND ELECTRONIC APPARATUS

(71) Applicant: JOLED Inc., Tokyo (JP)

(72) Inventors: Kenichi Aoyagi, Kanagawa (JP); Hayato Iwamoto, Kanagawa (JP)

(73) Assignee: JOLED Inc., Tokyo (JP)

( * ) Notice: Subject to any disclaimer, the term of this patent is extended or adjusted under 35 U.S.C. 154(b) by 252 days.

(21) Appl. No.: 14/432,871

(22) PCT Filed: Nov. 12, 2013

(86) PCT No.: PCT/JP2013/006658
§ 371 (c)(1),
(2) Date: Apr. 1, 2015

(87) PCT Pub. No.: WO2014/103138
PCT Pub. Date: Jul. 3, 2014

(65) Prior Publication Data
US 2015/0277017 A1    Oct. 1, 2015

(30) Foreign Application Priority Data

Dec. 27, 2012  (JP) ................. 2012-285643

(51) Int. Cl.
*F21V 7/04* (2006.01)
*H01L 27/32* (2006.01)
(Continued)

(52) U.S. Cl.
CPC .............. *G02B 6/005* (2013.01); *B32B 37/24* (2013.01); *B32B 38/0004* (2013.01); *F21V 9/08* (2013.01);
(Continued)

(58) Field of Classification Search
CPC ... G02B 6/005; G02B 6/0068; H01L 27/3211; H01L 27/322; B32B 37/22
See application file for complete search history.

(56) References Cited

U.S. PATENT DOCUMENTS 8,040,052 B2 * 10/2011 Kobayashi .......... H01L 27/3213
313/504
2006/0202613 A1 * 9/2006 Kawaguchi ........... H01L 27/322
313/506
(Continued)

FOREIGN PATENT DOCUMENTS

| CN | 1665363 A | 9/2005 |
|---|---|---|
| JP | 2002-299044 A | 10/2002 |

(Continued)

OTHER PUBLICATIONS

International Search Report; International Application No. PCT/JP2013/006658; International Filing Date: Nov. 12, 2013. (Form PCT/ISA/210).

(Continued)

*Primary Examiner* — Andrew Coughlin
(74) *Attorney, Agent, or Firm* — Michael Best & Friedrich LLP

(57) ABSTRACT

There is provided a display device including a plurality of light-emitting elements that are disposed on a first substrate, and a guide member that is disposed in a boundary between pixel regions corresponding to the light-emitting elements and guides light emitted from each of the light-emitting elements between the first substrate and a second substrate facing the first substrate in a main light emission direction of each of the light-emitting elements.

11 Claims, 18 Drawing Sheets

(51) Int. Cl.
*F21V 8/00* (2006.01)
*H01L 51/52* (2006.01)
*B32B 37/24* (2006.01)
*B32B 38/00* (2006.01)
*F21V 9/08* (2018.01)

(52) U.S. Cl.
CPC .......... *G02B 6/0068* (2013.01); *H01L 27/322* (2013.01); *H01L 27/3211* (2013.01); *H01L 51/5271* (2013.01); *B32B 2037/243* (2013.01); *B32B 2307/402* (2013.01); *B32B 2457/20* (2013.01); *H01L 27/3246* (2013.01); *H01L 27/3283* (2013.01); *Y10T 156/10* (2015.01); *Y10T 156/1082* (2015.01)

(56) References Cited

U.S. PATENT DOCUMENTS

2007/0145892 A1* 6/2007 Chen .................. H01L 51/5271 313/506

2010/0141116 A1 6/2010 Nomura et al.

FOREIGN PATENT DOCUMENTS

| | | |
|---|---|---|
| JP | 2007-157404 A | 6/2007 |
| JP | 2010-008861 A | 1/2010 |
| JP | 2010-134217 A | 6/2010 |
| WO | WO-02/15292 A2 | 2/2002 |
| WO | WO-2012/043611 A1 | 4/2012 |

OTHER PUBLICATIONS

Written Opinion of the International Searching Authority; International Application No. PCT/JP2013/006658; dated Jan. 21, 2014. (Form PCT/ISA/237).

Korean Office Action for Application No. 10-2015-7011290 dated Jun. 30, 2016.

Office Action from China Patent Office for application No. 2013800610951 dated Apr. 5, 2016.

* cited by examiner

[Fig. 1]
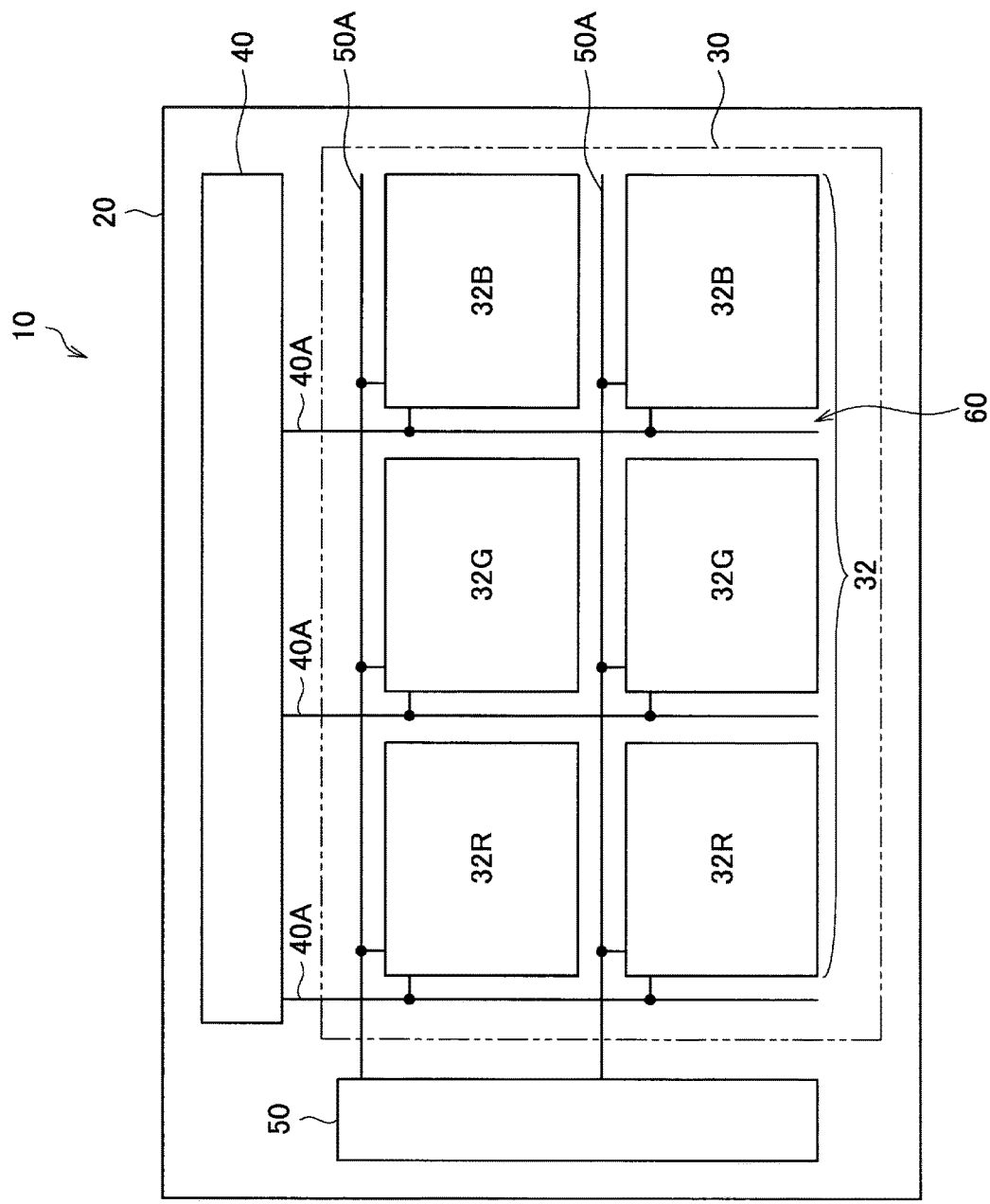

[Fig. 2]
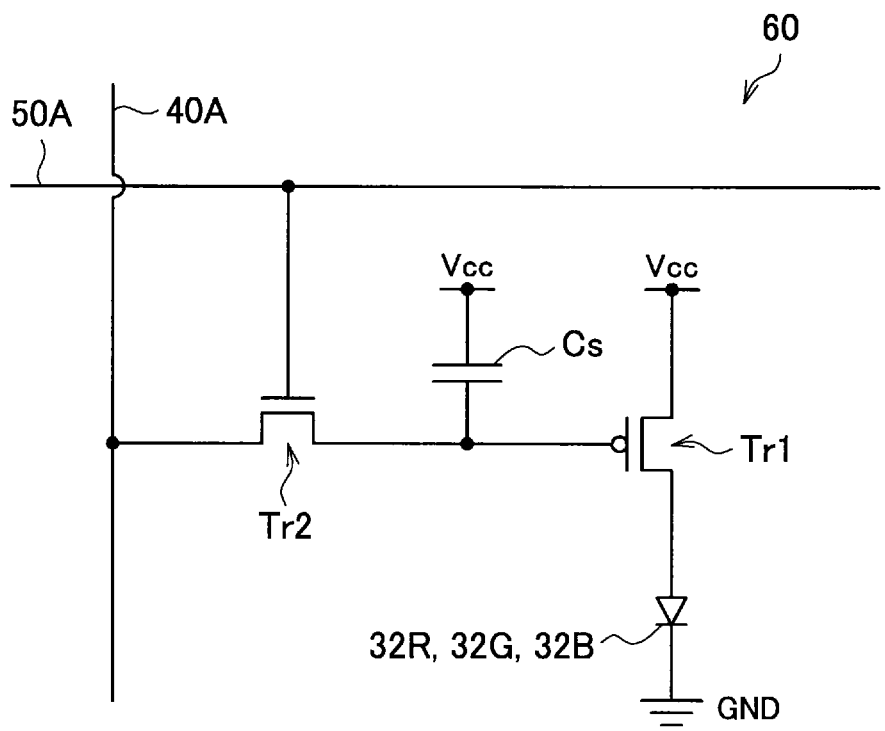

[Fig. 3]
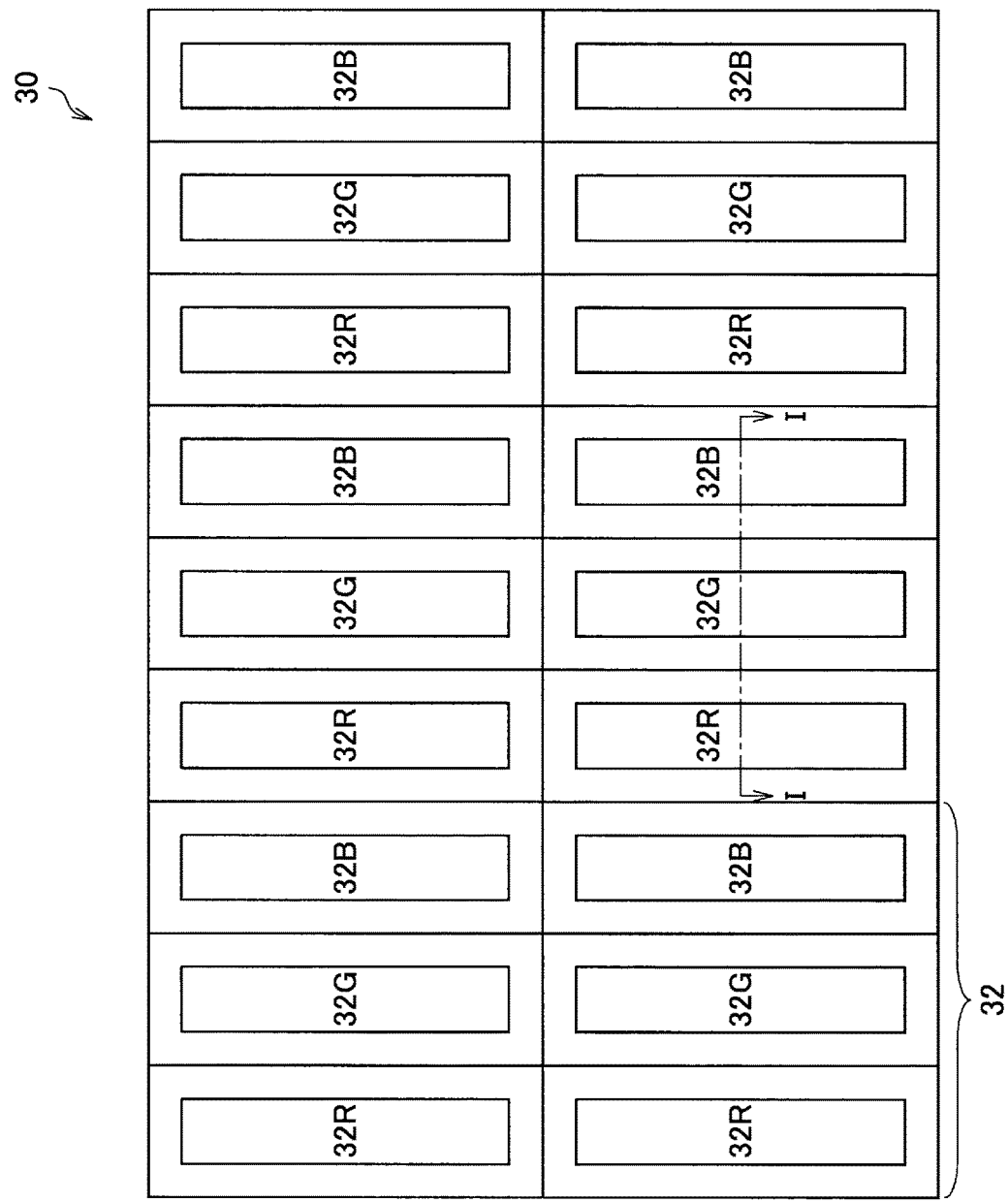

[Fig. 4]
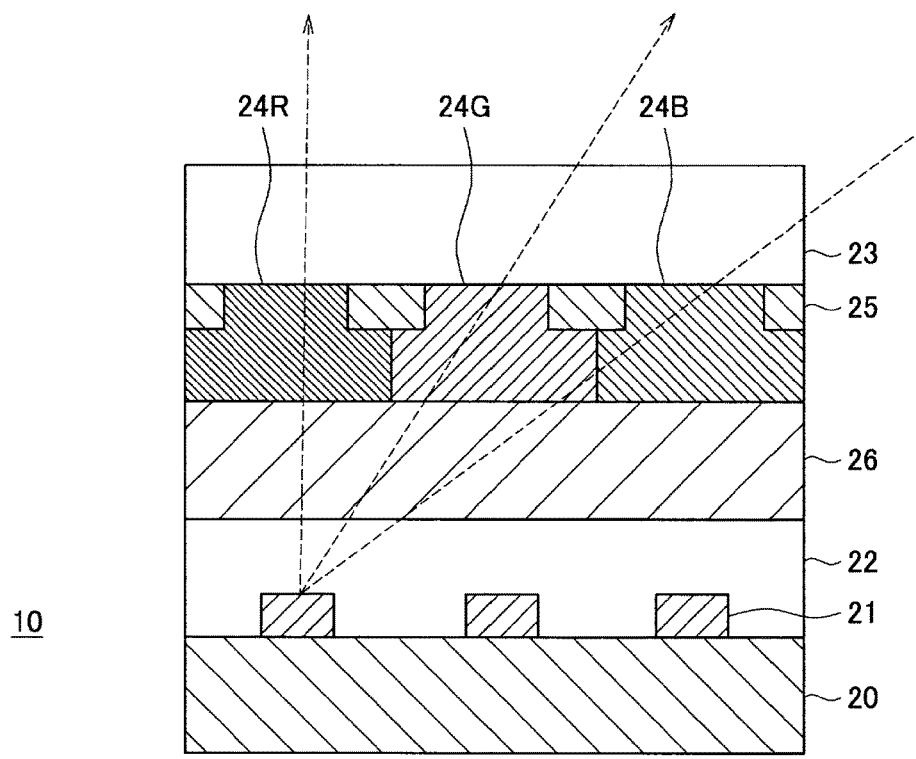
[Fig. 5]
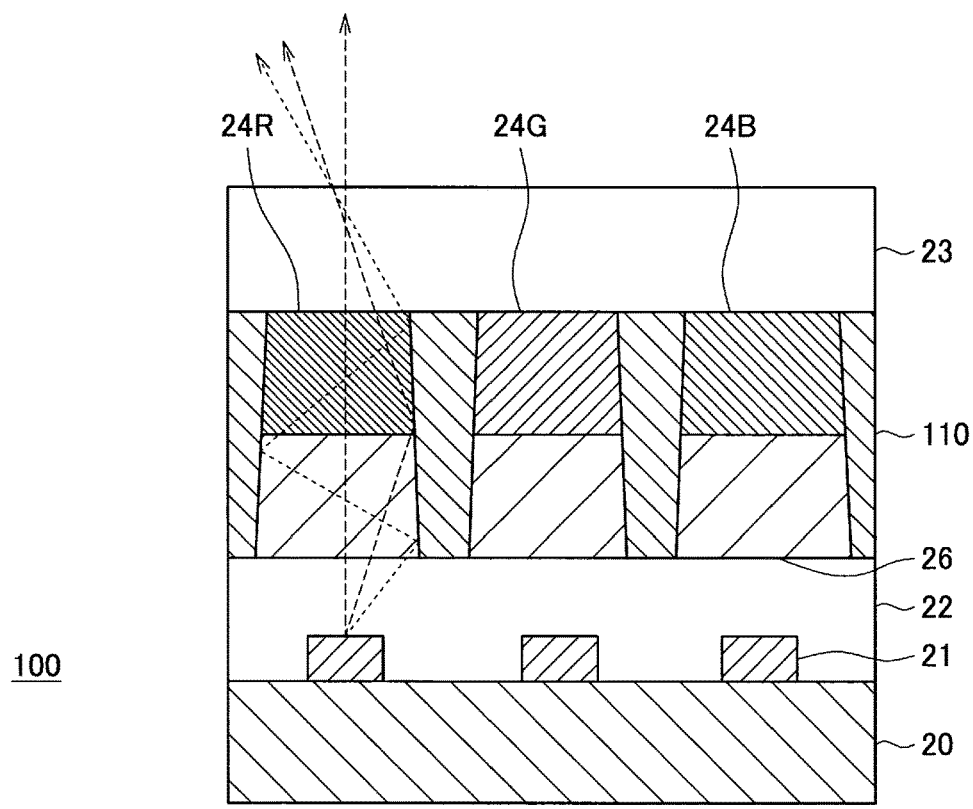

[Fig. 6]
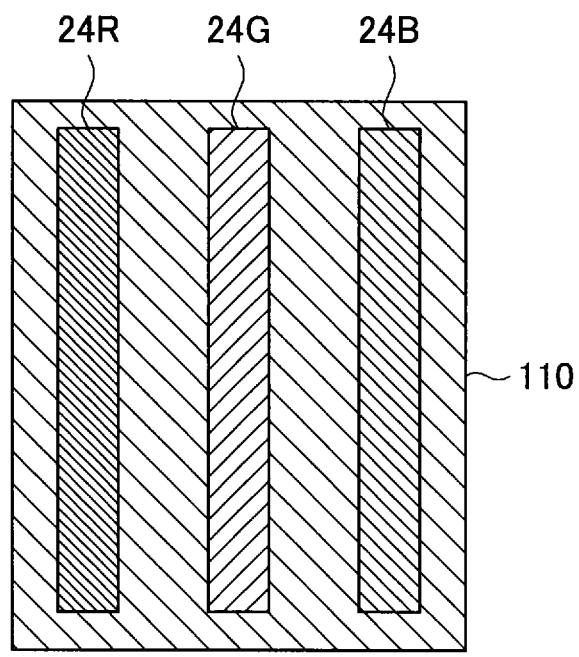

[Fig. 7]
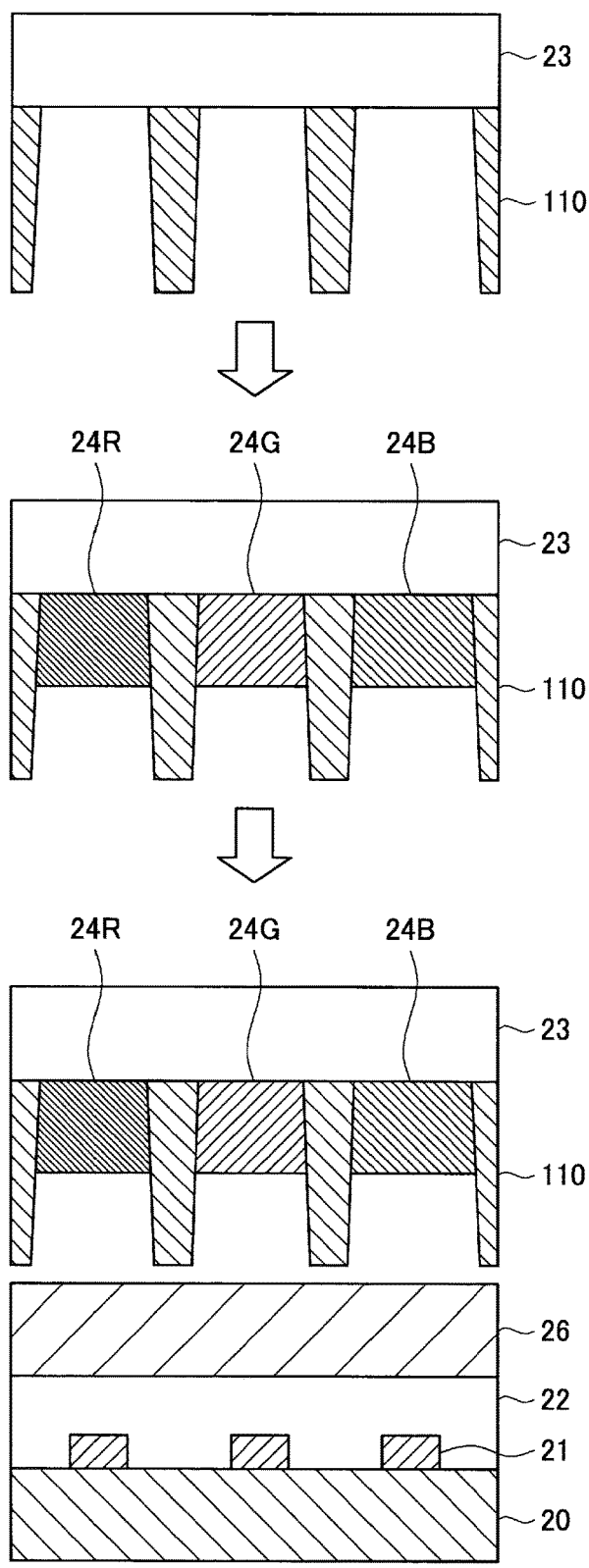

[Fig. 8]
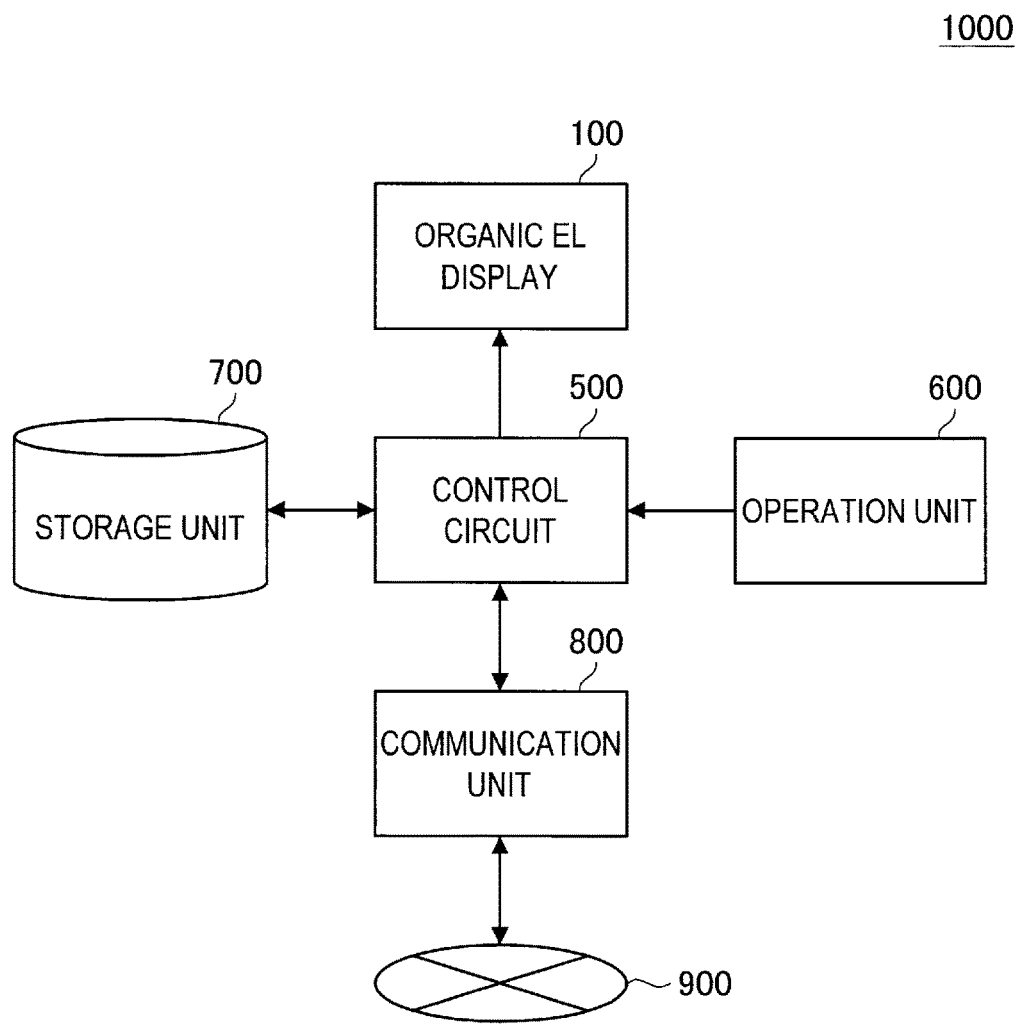

[Fig. 9]
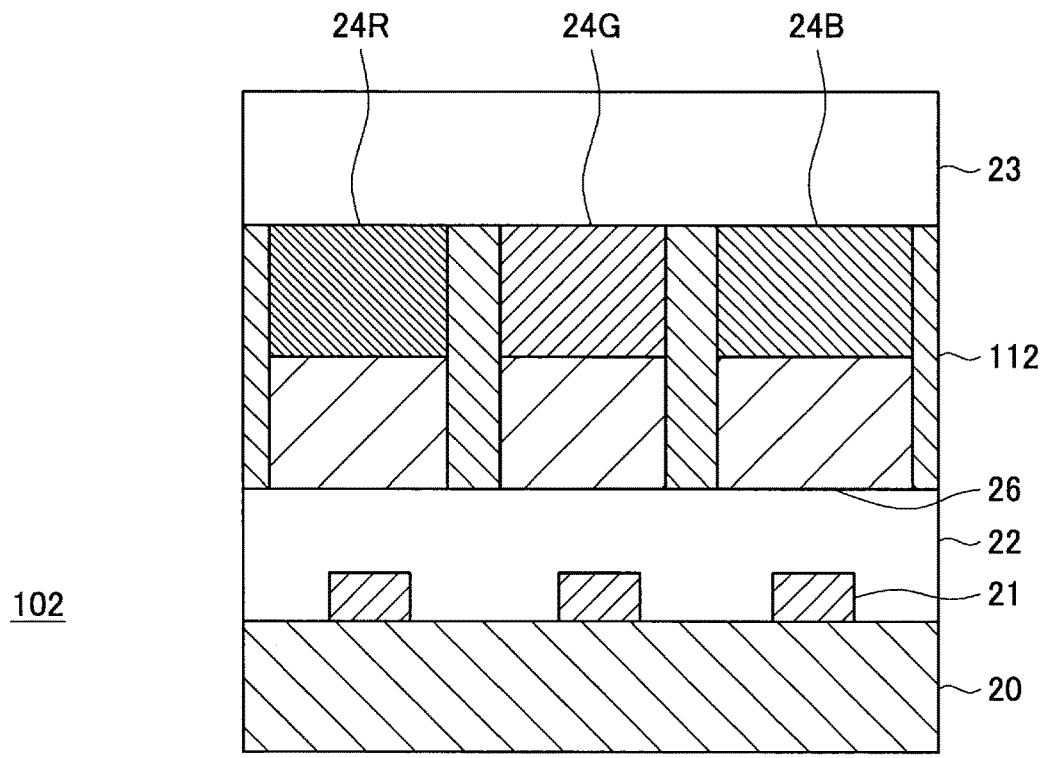
[Fig. 10]
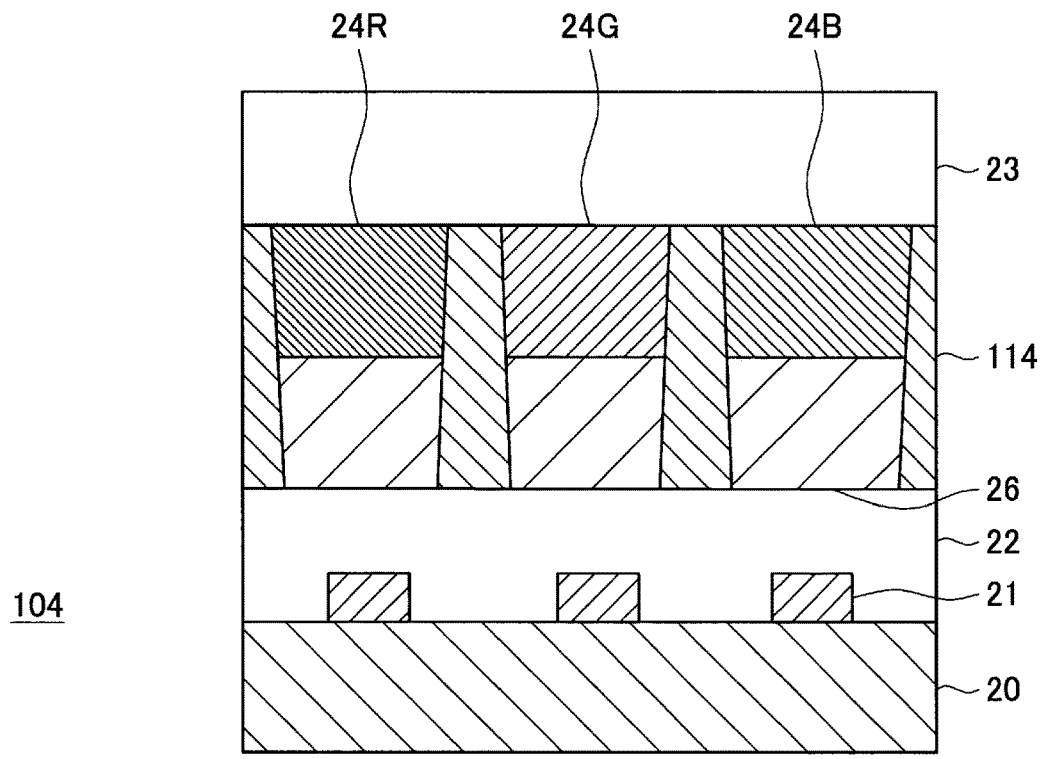

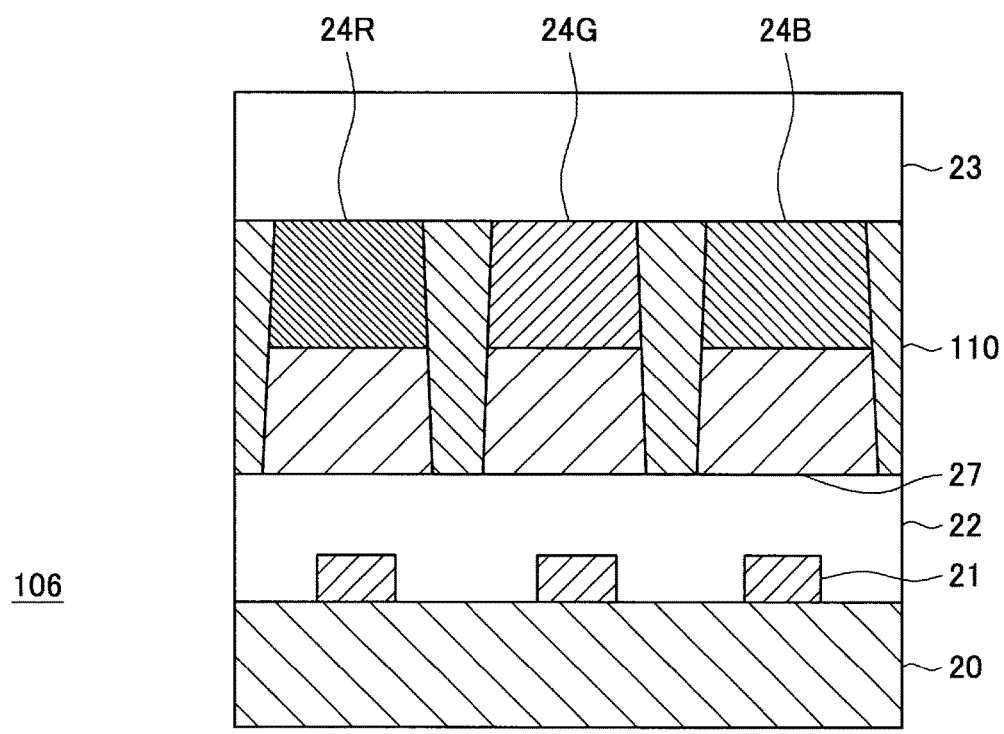
[Fig. 11A]

[Fig. 11B]
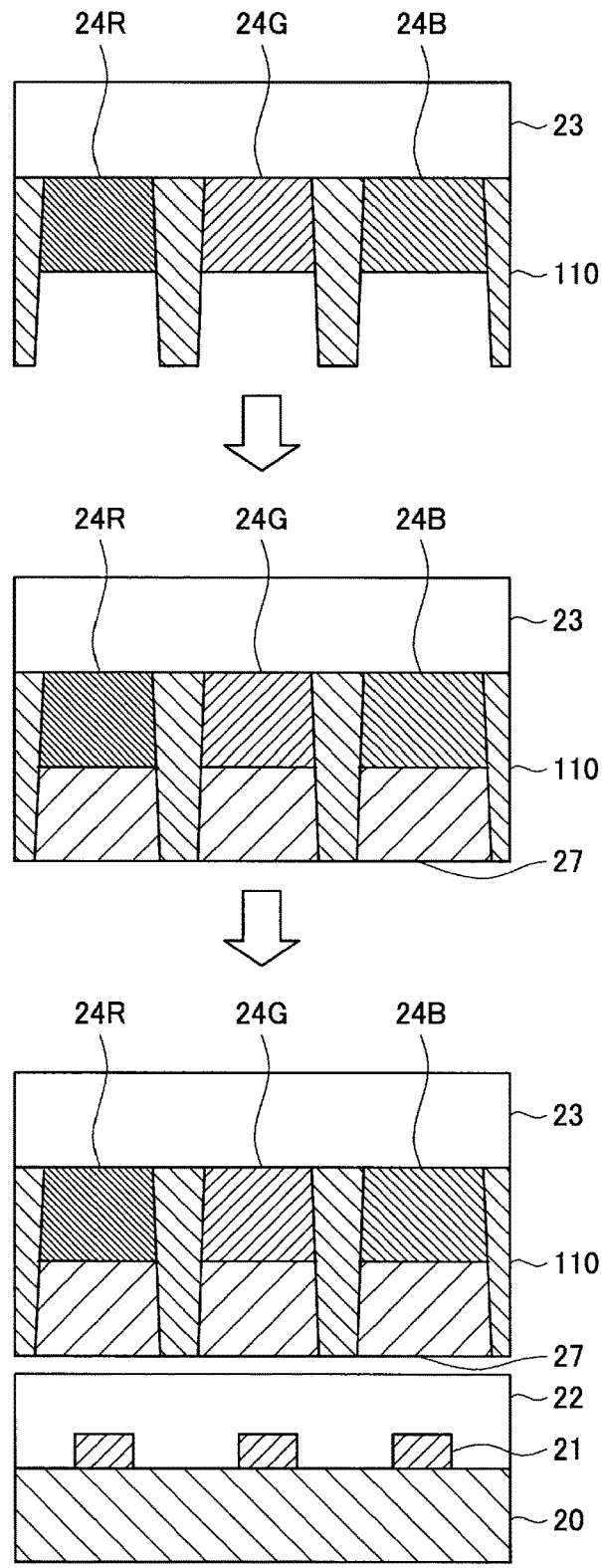

[Fig. 11C]
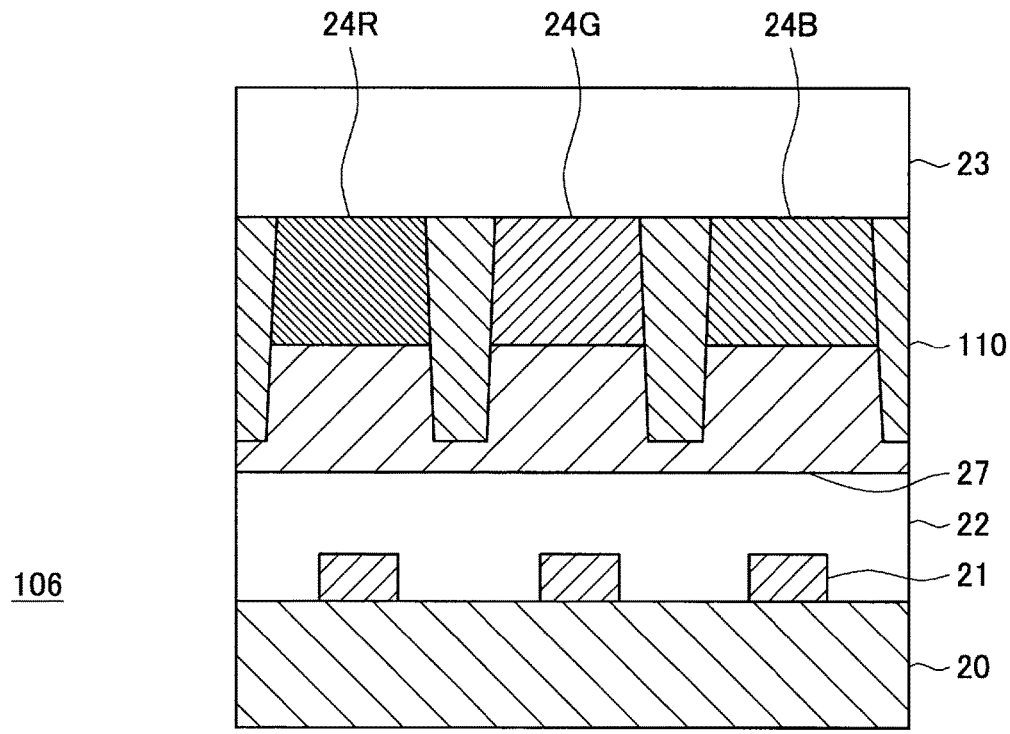
106
[Fig. 12]
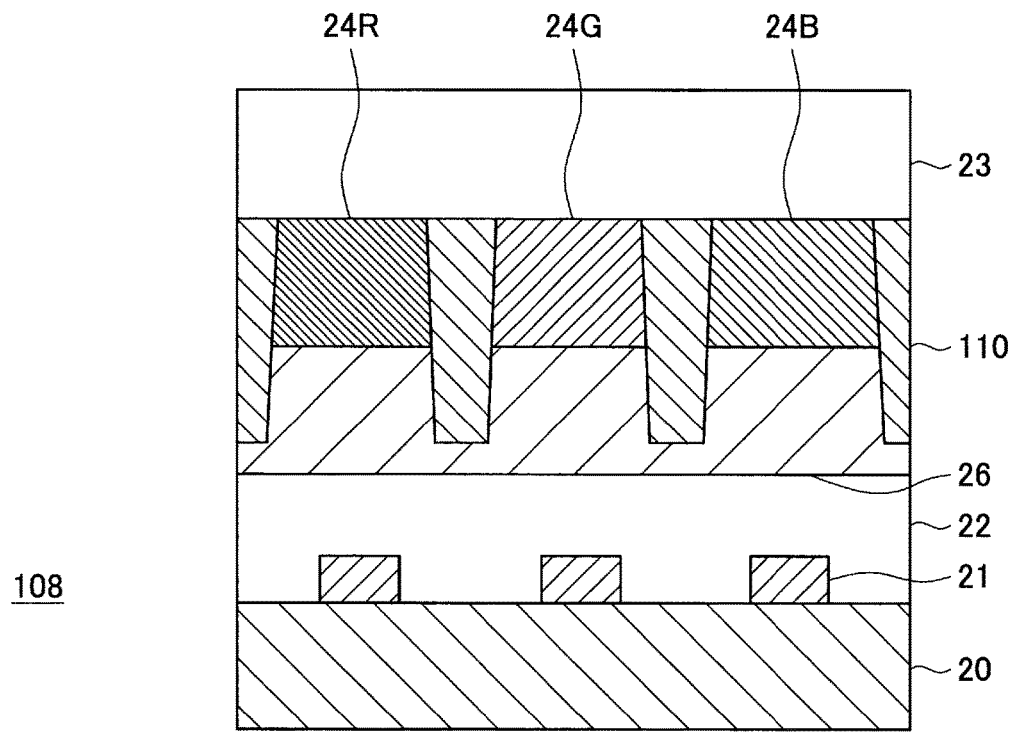
108

[Fig. 13]
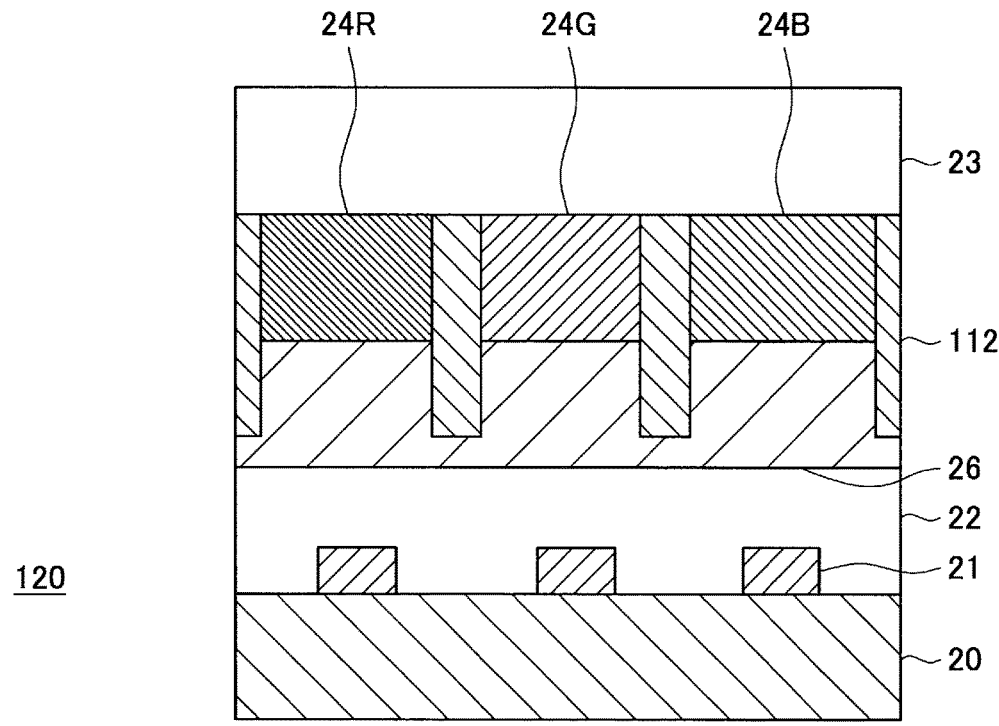
[Fig. 14]
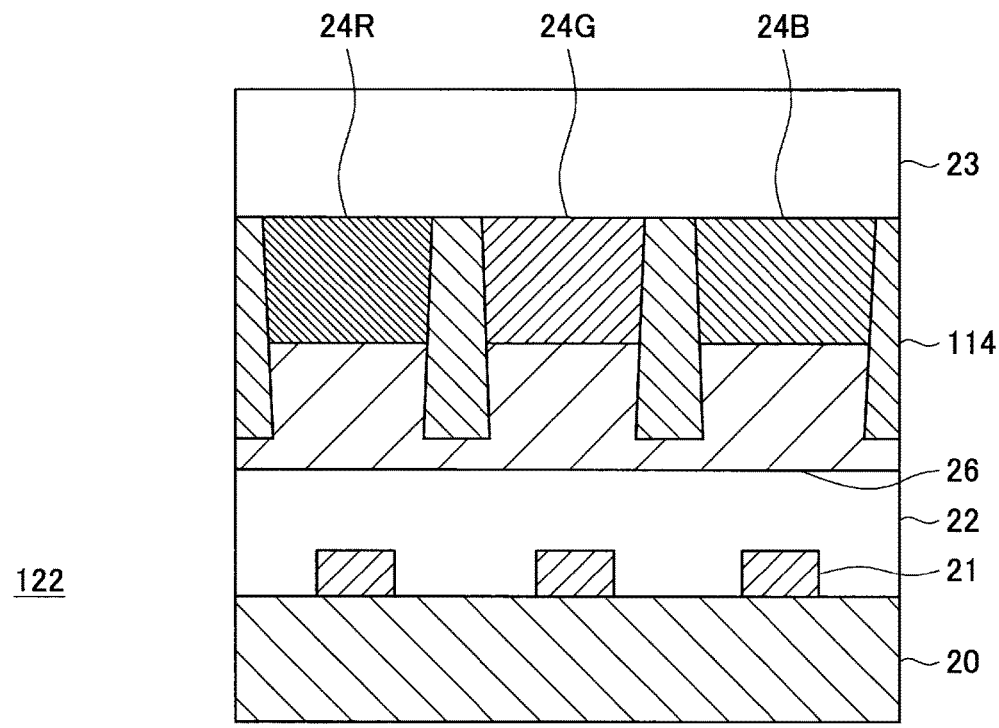

[Fig. 15]
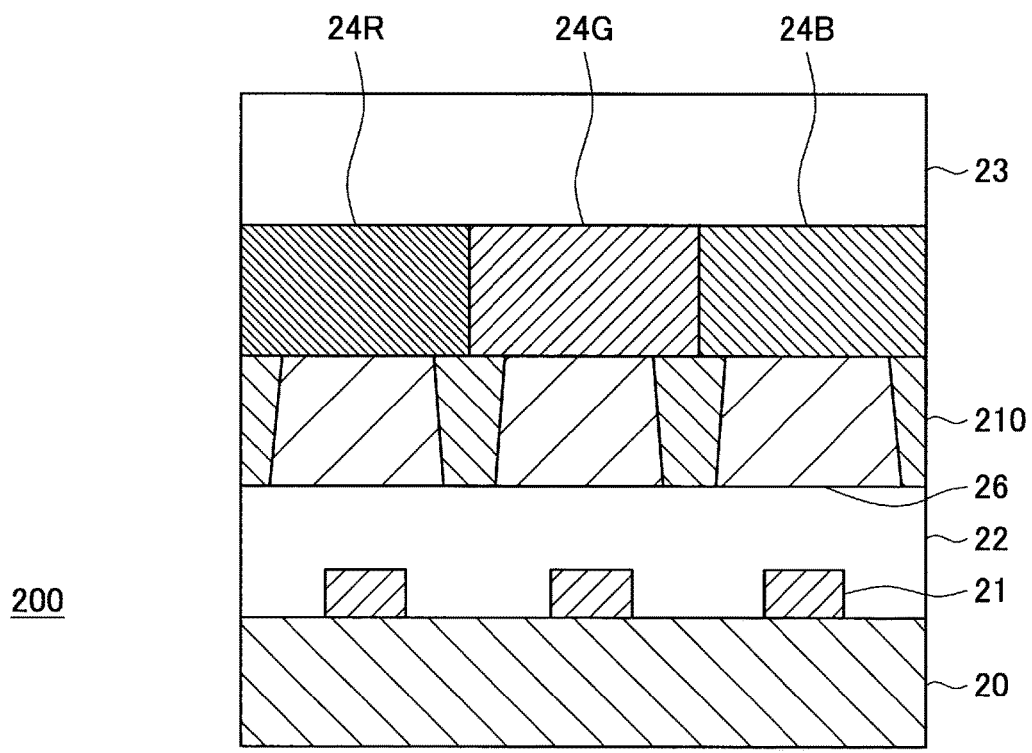

[Fig. 16]
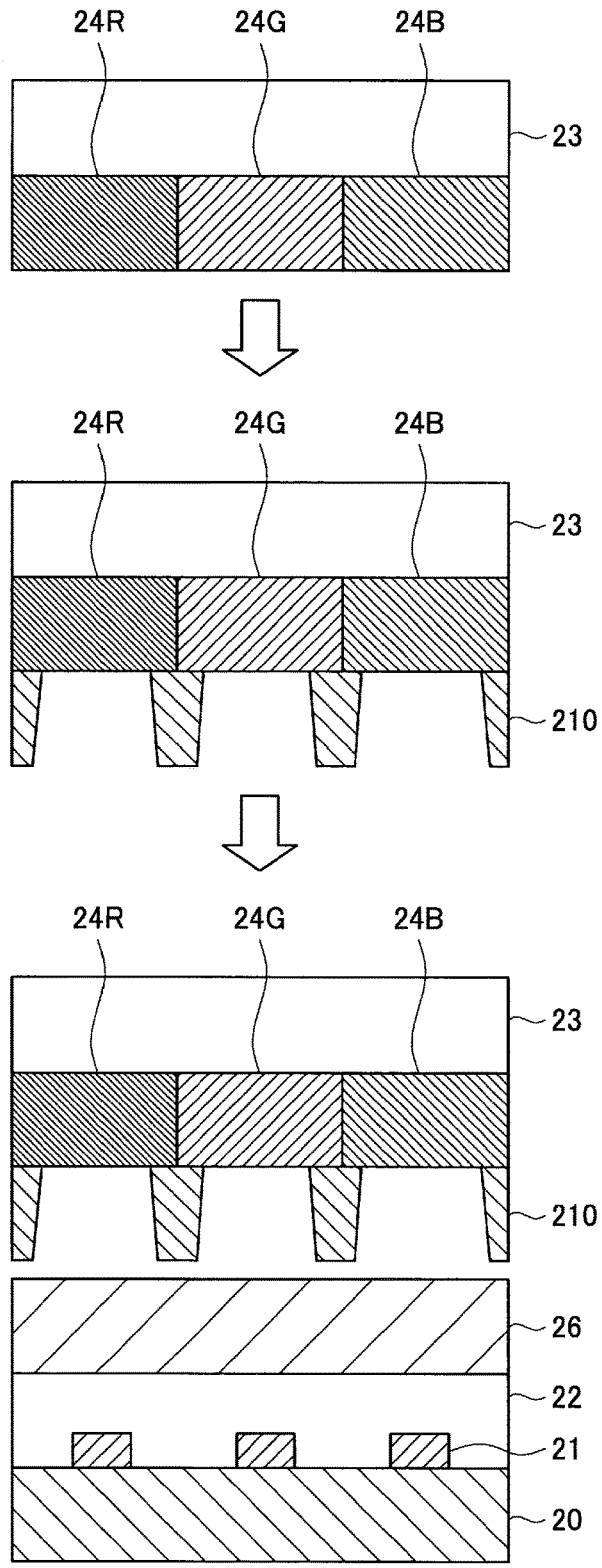

[Fig. 17]
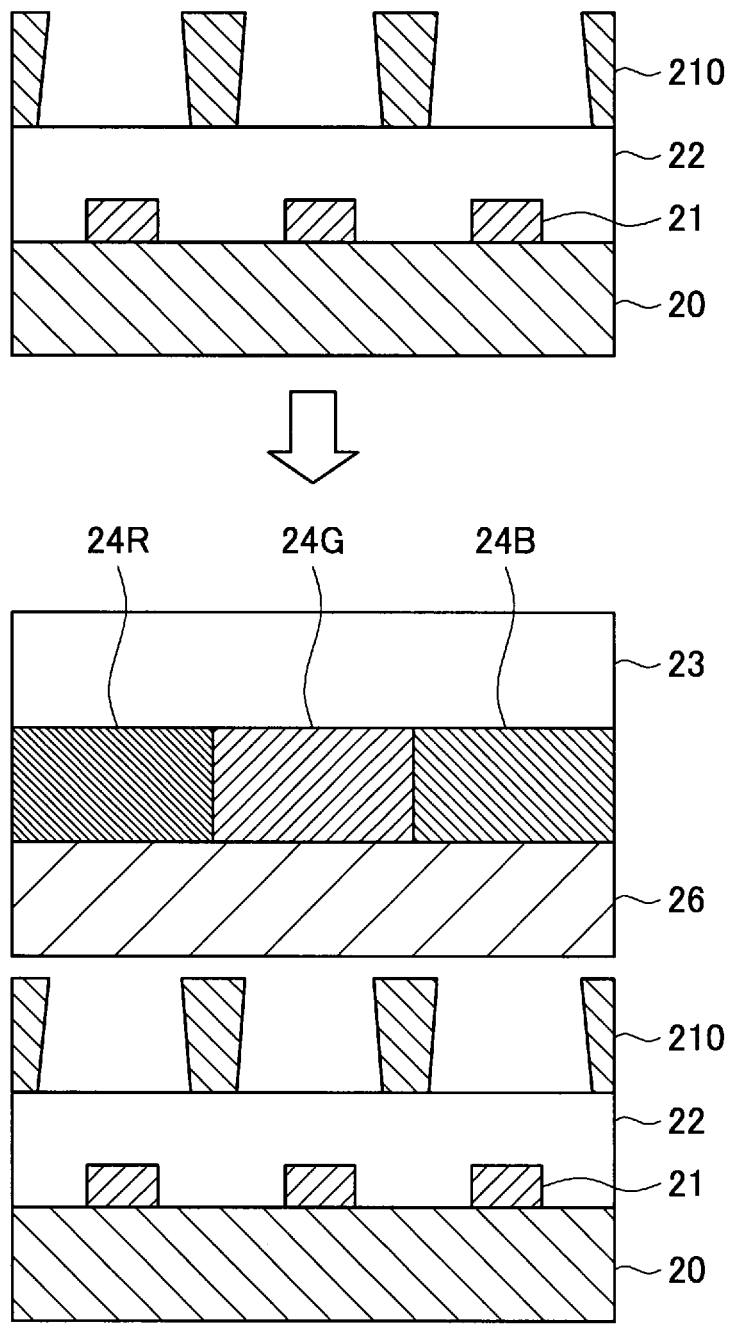

[Fig. 18]
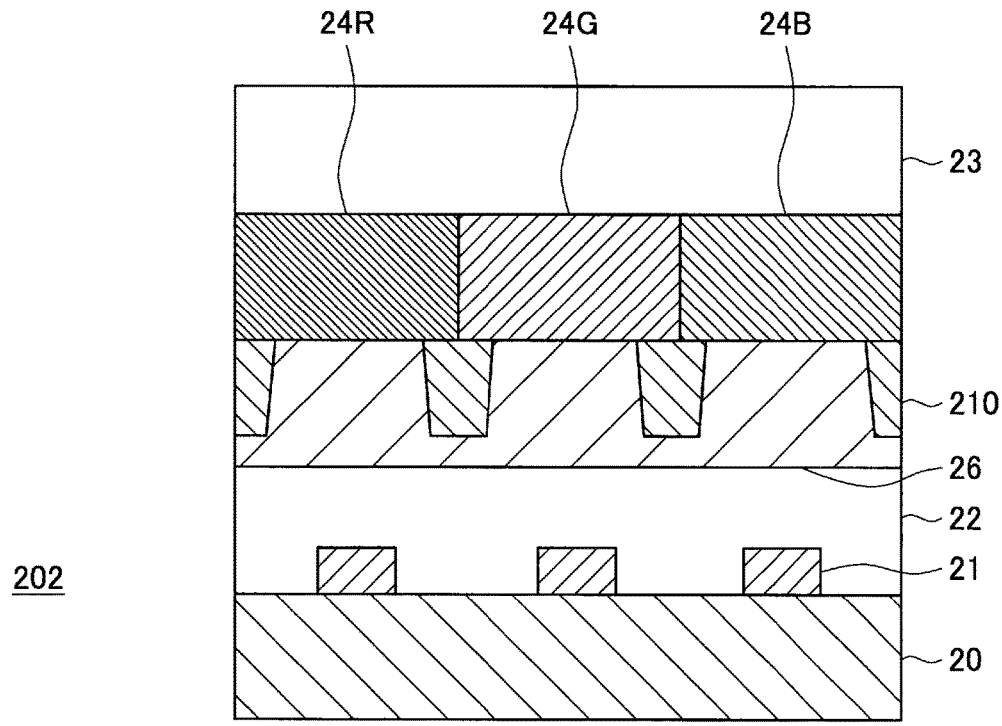
202
[Fig. 19]
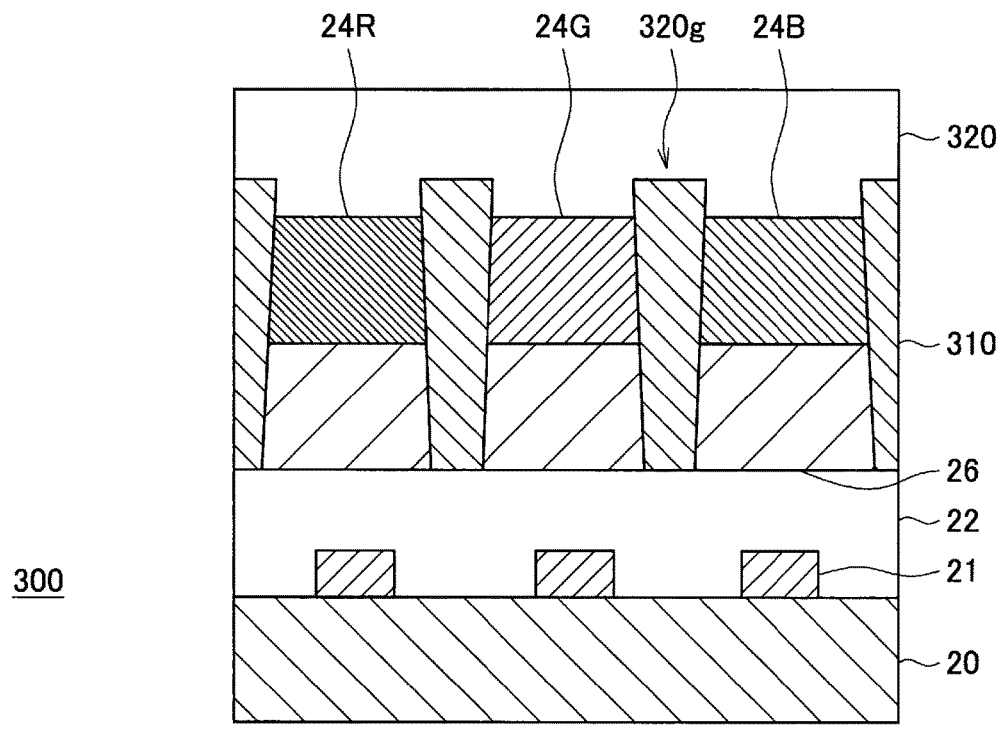
300

[Fig. 20]
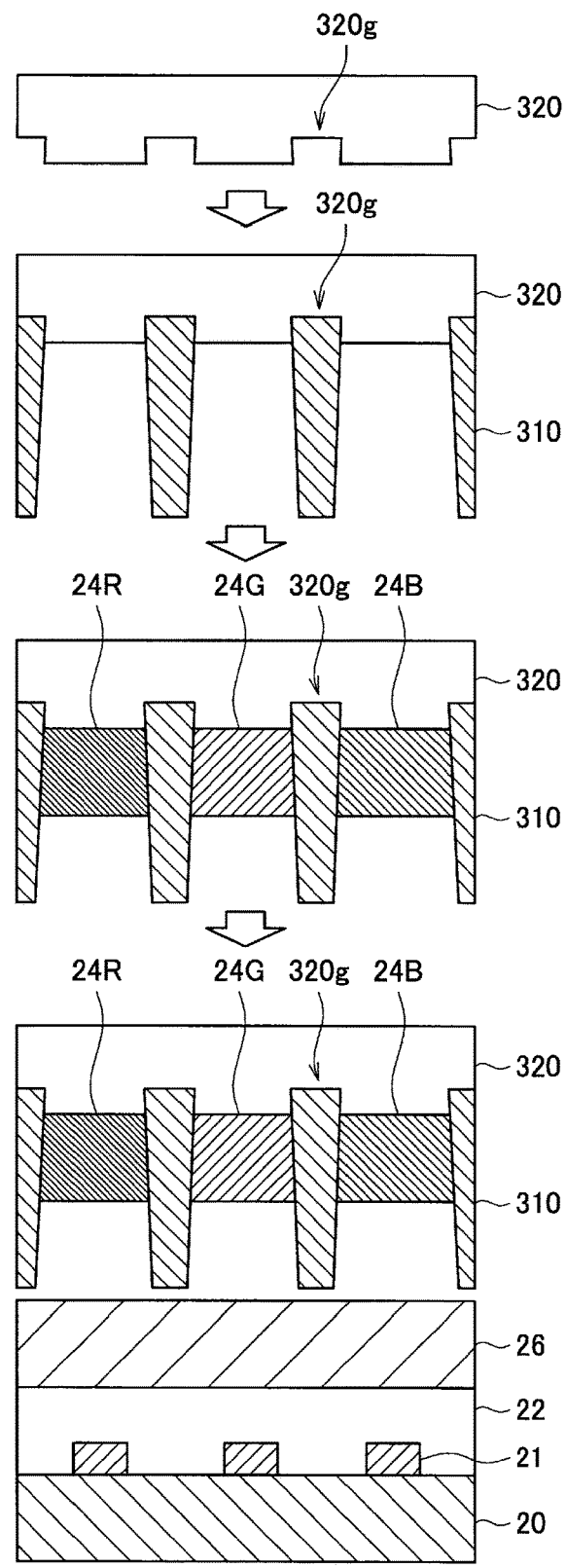

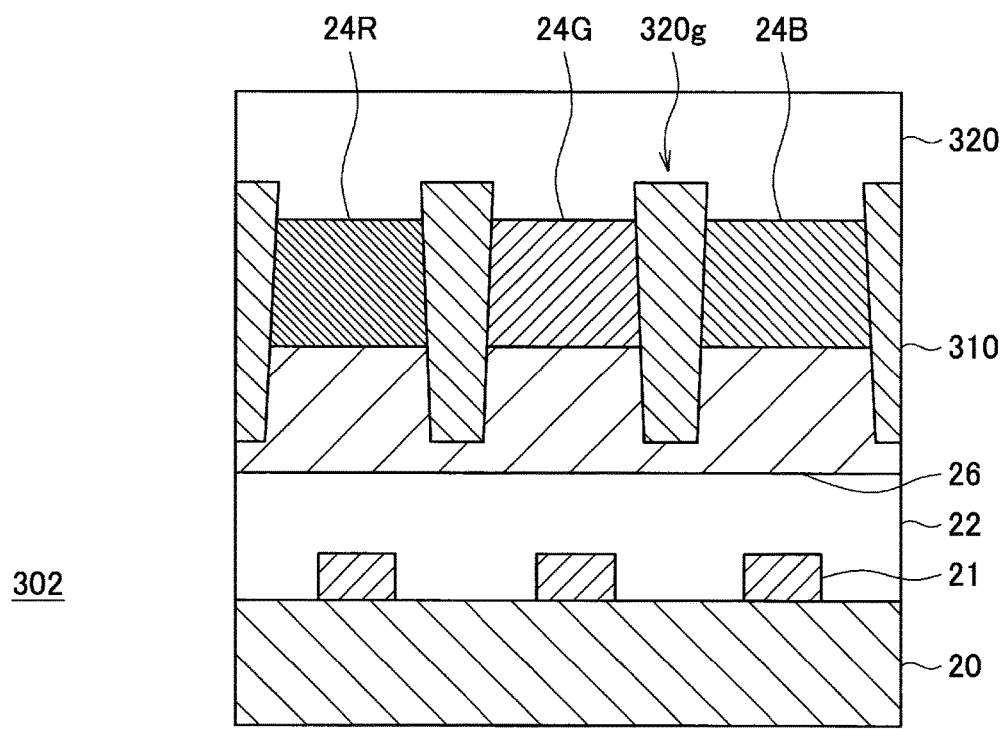
[Fig. 21]

DISPLAY DEVICE, METHOD OF MANUFACTURING DISPLAY DEVICE, AND ELECTRONIC APPARATUS

CROSS REFERENCE TO RELATED APPLICATIONS

This application claims the benefit of Japanese Priority Patent Application JP 2012-285643 filed Dec. 27, 2012, the entire contents of which are incorporated herein by reference.

TECHNICAL FIELD

The present disclosure relates to a display device, a method of manufacturing the display device, and an electronic apparatus, and more particularly, to a display device including a light-emitting element.

BACKGROUND ART

For example, top-emission type display devices using organic electro-luminescence (EL) light-emitting elements, inorganic EL light-emitting elements, or the like, an element substrate in which the light-emitting elements are disposed and a sealing substrate facing the element substrate are provided. Light emitted from the light-emitting elements passes through the transparent sealing substrate and is observed. For example, when each light-emitting element emits white light, the light emitted from each light-emitting element passes through color filters formed in the sealing substrate and is observed as light of the color of each pixel. Further, when the light-emitting elements emit light with colors of respective pixels, such as red, green, and blue, color filters are also used in some cases to improve color purity.

In the foregoing sealing substrate (also referred to as a color filter substrate), a light-shielding member called a black matrix is formed at a position corresponding to a boundary between pixel regions in order to improve contrast. A technology for the black matrix is disclosed in, for example, PTL 1. According to the technology of PTL 1, in order to suppress a diffraction phenomenon of light occurring in a boundary between a transmission region of a color filter and the region of a black matrix, a gradient of an optical density is formed in the transmission region.

CITATION LIST

Patent Literature

PTL 1: JP 2010-008861A

SUMMARY

Technical Problem

However, since the sealing substrate in which the black matrix is formed and the element substrate are separately prepared and adhered, the sealing substrate and the element substrate are distant to some extent. Further, since light emitted from the light-emitting element is oriented in directions other than the main light emission direction (that is, a direction perpendicular to the element substrate), light emitted from the light-emitting element of a given pixel may be mixed into other adjacent pixels in a portion between the element substrate and the sealing substrate in some cases.

According to an embodiment of the present disclosure, it is desirable to provide a novel and improved display device, a novel and improved method of manufacturing the display device, and a novel and improved electronic apparatus capable of preventing mixture of light emitted from pixels between a substrate in which light-emitting elements are formed and a substrate facing the substrate.

Solution to Problem

According to an embodiment of the present disclosure, there is provided a display device including a plurality of light-emitting elements that are disposed on a first substrate, and a guide member that is disposed in a boundary between pixel regions corresponding to the light-emitting elements and guides light emitted from each of the light-emitting elements between the first substrate and a second substrate facing the first substrate in a main light emission direction of each of the light-emitting elements.

According to an embodiment of the present disclosure, there is provided a method of manufacturing a display device, including forming a guide member, which is disposed in a boundary between pixel regions corresponding to a plurality of light-emitting elements disposed on a first substrate and guides light emitted from each of the light-emitting elements between the first substrate and a second substrate facing the first substrate in a main light emission direction of each of the light-emitting elements, on the first substrate or the second substrate, and bonding the second substrate with the first substrate on which the plurality of light-emitting elements are disposed.

According to an embodiment of the present disclosure, there is provided an electronic apparatus including a display device configured to include a plurality of light-emitting elements that are disposed on a first substrate and a guide member that is disposed in a boundary between pixel regions corresponding to the light-emitting elements and guides light emitted from each of the light-emitting elements between the first substrate and a second substrate facing the first substrate in a main light emission direction of each of the light-emitting elements.

By forming the guide member that guides light emitted from the light-emitting element between the first and second substrates, the light emitted from the light-emitting element and oriented in a direction other than the main light emission direction is prevented from being mixed into other adjacent pixels, even when the substrates are distant to some extent.

Advantageous Effects of Invention

According to one or more of embodiments of the present disclosure, it is possible to prevent mixture of emitted light in pixels between a substrate in which light-emitting elements are formed and a substrate facing the substrate.

BRIEF DESCRIPTION OF DRAWINGS

FIG. 1 is a diagram illustrating an example of the configuration of a display device relevant to a relevant technology according to embodiments of the present disclosure.

FIG. 2 is a diagram illustrating an example of the configuration of a pixel driving circuit formed in an organic EL display.

FIG. 3 is a diagram illustrating an example of a planar configuration of a display region in the organic EL display.

FIG. 4 is a cross-sectional view taken along the line I-I of FIG. 3 illustrating an example of a cross-sectional configuration of the display region.

FIG. 5 is a diagram illustrating an example of a cross-sectional configuration of a display region in a display device according to a first embodiment of the present disclosure.

FIG. 6 is a diagram illustrating an example of a planar configuration of the display region illustrated in FIG. 5.

FIG. 7 is a diagram illustrating states of the display device in respective processes of a method of manufacturing the display device according to the first embodiment of the present disclosure.

FIG. 8 is a schematic block diagram illustrating the configuration of an electronic apparatus according to the first embodiment of the present disclosure.

FIG. 9 is a diagram for describing a modification example of the first embodiment of the present disclosure.

FIG. 10 is a diagram for describing the modification example of the first embodiment of the present disclosure.

FIG. 11A is a diagram for describing the modification example of the first embodiment of the present disclosure.

FIG. 11B is a diagram illustrating states of the display device in respective processes of a method of manufacturing a display device illustrated in FIG. 11A.

FIG. 11C is a diagram illustrating an alternative configuration example of the example illustrated in FIG. 11A.

FIG. 12 is a diagram for describing the modification example of the first embodiment of the present disclosure.

FIG. 13 is a diagram for describing the modification example of the first embodiment of the present disclosure.

FIG. 14 is a diagram for describing the modification example of the first embodiment of the present disclosure.

FIG. 15 is a diagram illustrating an example of a cross-sectional configuration of a display region in a display device according to a second embodiment of the present disclosure.

FIG. 16 is a diagram illustrating states of the display device in respective processes of a first method of manufacturing the display device according to the second embodiment of the present disclosure.

FIG. 17 is a diagram illustrating states of the display device in respective processes of a second method of manufacturing the display device according to the second embodiment of the present disclosure.

FIG. 18 is a diagram for describing a modification example of the second embodiment of the present disclosure.

FIG. 19 is a diagram illustrating an example of a cross-sectional configuration of a display region in a display device according to a third embodiment of the present disclosure.

FIG. 20 is a diagram illustrating states of the display device in respective processes of a method of manufacturing the display device according to the third embodiment of the present disclosure.

FIG. 21 is a diagram for describing a modification example of the third embodiment of the present disclosure.

DESCRIPTION OF EMBODIMENTS

Hereinafter, preferred embodiments of the present disclosure will be described in detail with reference to the appended drawings. Throughout this specification and the drawings, the same reference numerals are given to constituent elements having substantially the same functional configurations and the repeated description will be omitted.

Hereinafter, the description will be made in the following order.

1. Description of Relevant Technology
2. First Embodiment
2-1. Configuration of display device
2-2. Method of Manufacturing Display Device
2-3. Application to Electronic Apparatus
2-4. Modification Examples
3. Second Embodiment
3-1. Configuration of Display Device
3-2. Method of Manufacturing Display Device
3-3. Modification Examples
4. Third Embodiment
4-1. Configuration of Display Device
4-2. Method of Manufacturing Display Device
4-3. Modification Examples
5. Supplement 1. Description of Relevant Technology To facilitate better understanding of embodiments of the present disclosure, a relevant technology will first be described with reference to FIGS. 1 to 4.

(Entire Configuration)

FIG. 1 is a diagram illustrating an example of the configuration of a display device relating to the relevant technology according to embodiments of the present disclosure. The display device relevant to the relevant technology according to embodiments of the present disclosure is an organic EL display 10.

Referring to FIG. 1, the organic EL display 10 includes a display region 30 in which red light-emitting elements 32R, green light-emitting elements 32G, and blue light-emitting elements 32B are arrayed in a matrix form on an element substrate 20. A pair of red light-emitting elements 32R, a pair of green light-emitting elements 32G, and a pair of blue light-emitting elements 32B form a pixel 32. A signal line driving circuit 40 and a scanning line driving circuit 50 are formed as video display drivers in the periphery of the display region 30.

In the display region 30, a pixel driving circuit 60 connected to each of the red light-emitting elements 32R, the green light-emitting elements 32G, and the blue light-emitting elements 32B is provided. The configuration of the pixel driving circuit 60 will be described in more detail below with reference to FIG. 2.

(Configuration of Pixel Driving Circuit)

FIG. 2 is a diagram illustrating an example of the configuration of the pixel driving circuit 60 in which the organic EL display 10 is formed. In the present embodiment, the pixel driving circuit 60 is an active type driving circuit that is virtually formed in a lower electrode of a light-emitting element to be described below.

Referring to FIG. 2, in the pixel driving circuit 60, a driving transistor Tr1 and a writing transistor Tr2 are formed and a capacitor Cs is connected between the driving transistor Tr1 and the writing transistor Tr2. The red light-emitting element 32R, the green light-emitting element 32G, or the blue light-emitting element 32B is connected in series to the driving transistor Tr1 between a first power line Vcc and a second power line GNG.

Here, the driving transistor Tr1 and the writing transistor Tr2 are general thin film transistors (TFTs). As the structure of the TFT, various structures, for example, an inverse stagger structure (bottom gate type) or a stagger structure (top gate type), can be used.

In the pixel driving circuit 60, a plurality of signal lines 40A in a column direction and a plurality of scanning lines 50A in a row direction are arrayed. Each of intersections between the signal lines 40A and the scanning lines 50A corresponds to one of the red light-emitting element 32R, the green light-emitting element 32G, and the blue light-emitting element 32B. Each of the signal lines 40A is connected to the foregoing signal line driving circuit 40. The signal line driving circuit 40 supplies an image signal to a source electrode of the writing transistor Tr2 via the signal line 40A. Likewise, each of the scanning lines 50A is connected to the foregoing scanning line driving circuit 50. The scanning line driving circuit 50 sequentially supplies scanning signals to gate electrodes of the writing transistors Tr2 via the scanning lines 50A.

(Configuration of Display Region)

FIG. 3 is a diagram illustrating an example of a planar configuration of the display region 30 in the organic EL display 10. FIG. 4 is a cross-sectional view taken along the line I-I of FIG. 3 illustrating an example of the cross-sectional configuration of the display region 30. In the display region 30, as illustrated in FIG. 3, the red light-emitting elements 32R, the green light-emitting elements 32G, and the blue light-emitting elements 32B are arrayed in a matrix form. A pair of red light-emitting elements 32R, a pair of green light-emitting elements 32G, and a pair of blue light-emitting elements 32B form the pixel 32.

In the display region 30 of the organic EL display 10, as illustrated in FIG. 4, the element substrate 20 and the sealing substrate 23 are adhered via an adhesive layer 26. A plurality of light-emitting elements 21 are disposed on the element substrate 20 and the light-emitting elements 21 are covered with a protective layer 22. On the other hand, on the side of the sealing substrate 23, color filters 24 (a red color filter 24R, a green color filter 24G, and a blue color filter 24B) are disposed and a black matrix 25 is formed between each of the boundaries of the color filters 24. The adhesive layer 26 is located between the protective layer 22 and the color filters 24. Hereinafter, each of the constituent elements will be described.

The element substrate 20 is a supporter having a flat surface. For example, a metal foil, a film or sheet made of a resin, or the like is used as the element substrate 20. Since the organic EL display 10 is a top emission type display device in which light of the light-emitting element is taken out from the side of the sealing substrate 23, the element substrate 20 may not necessarily be transparent. Although not illustrated in the drawing, a TFT layer in which the pixel driving circuit 60 described above with reference to FIG. 2 is formed or a planarization film used to planarize the surface of the TFT layer may be formed on the element substrate 20.

The light-emitting element 21 emits white, red, green, or blue light or the like by applying a voltage to a light-emitting material with at least one peak wavelength in a predetermined wavelength range. The light-emitting element 21 includes a light-emitting material layer and includes a lower electrode and an upper electrode applying a voltage to the light-emitting material layer. The lower electrode is formed of, for example, an aluminum alloy and is connected to the pixel driving circuit formed on the element substrate 20. The upper electrode is formed of a transparent electrode material such as indium zinc oxide (IZO). A hole injection layer, a hole transparent layer, an electron transport layer, an electron injection layer, and the like can be stacked above or below the light-emitting material layer. In the drawing, the light-emitting elements are independently formed. However, the light-emitting elements may be commonly formed in layers other than the lower electrodes and the light-emitting material layer.

The protective layer 22 is formed of, for example, an inorganic amorphous-based insulation material and is formed on the entire surface on the element substrate 20 so as to cover the light-emitting elements 21. The protective layer 22 has, for example, an insulation property or a non-permeable property, and thus protects the light-emitting elements 21. Further, the protective layer 22 may not necessarily be formed or an adhesive layer 26 may be located above the light-emitting elements 21 (the upper electrodes).

The sealing substrate 23 (transparent substrate) is formed of glass or the like and seals a stack structure formed in the display region 30. On the sealing substrate 23, the color filters 24 (the red color filter 24R, the green color filter 24G, and the blue color filter 24B) for the color of each pixel are disposed in the pixel region corresponding to each light-emitting element 21. The black matrix 25 is formed in each of the boundaries of the color filters 24.

Here, the black matrix 25 shields the boundary region of the color filters 24 of each color from light, and thus improves the contrast of an image to be displayed. The black matrix 25 is formed of, for example, a light-shielding metal such as titanium, titanium nitride, tantalum, tantalum nitride, or tungsten or a resin film containing a black colorant such as carbon. Aluminum, copper, or the like can also be used, although reflectance of the visible light is lower than those of the foregoing metals. A metal layer may be formed as, for example, a stack film of the foregoing materials. The thickness of the black matrix 25 is thinner than thickness of the color filter 24 or is the same as thickness of the color filter 24, as illustrated in the drawing.

The adhesive layer 26 is formed of a thermosetting resin, an ultraviolet curable resin, or the like and is interposed between the element substrate 20 and the sealing substrate 23 to adhere these substrates.

Since the element substrate 20 and the sealing substrate 23 are separately provided and adhered in the foregoing organic EL display 10, the element substrate 20 and the sealing substrate 23 are distant to some extent, and specifically, are separated by at least a distance corresponding to the thickness of the adhesive layer 26. Here, the light emitted from the light-emitting elements 21 is not oriented only in a main light emission direction, that is, the direction perpendicular to the element substrate 20, but also in an inclination direction with respect to the element substrate 20, as illustrated in the drawing. Since the light passes through the adhesive layer 26, the light emitted in the inclination direction may be mixed into other adjacent pixel regions through the boundary of the pixel regions. When light which is not the light of the original pixel is mixed, the image quality of an image to be displayed by the pixel may, of course, deteriorate.

Accordingly, in embodiments of the present disclosure to be described below, configurations realized to prevent the mixture of the emitted light between the foregoing pixels will be suggested. In the embodiments to be described below, since the entire configuration, the configuration of the pixel driving circuit, and the planar surface configuration of the display region are the same as those of the foregoing relevant technology, the detailed description thereof will be omitted. In the cross-sectional configuration of the display region, the same reference numerals are given to the same constituents as those of the foregoing relevant technology, and the detailed description thereof will be omitted in some cases.

2. First Embodiment

First, a first embodiment of the present disclosure will be described.

2-1. Configuration of Display Device

FIG. 5 is a diagram illustrating an example of the cross-sectional configuration of a display region in a display device according to a first embodiment of the present disclosure. The display device according to the present embodiment is an organic EL display 100.

In the display region of the organic EL display 100, an element substrate 20 and a sealing substrate 23 are adhered via an adhesive layer 26. A plurality of light-emitting elements 21 are disposed on the element substrate 20 and the light-emitting elements 21 are covered with a protective layer 22. On the other hand, on the side of the sealing substrate 23, color filters 24 (a red color filter 24R, a green color filter 24G, and a blue color filter 24B) are disposed.

Further, a guide member 110 is formed in a boundary of the color filters 24 of respective colors. The guide member 110 penetrates the color filters 24 and comes into contact with the surface of the sealing substrate 23 on one side and penetrates the adhesive layer 26 and comes into contact with the protective layer 22 on the element substrate 20 on the other side. The guide member 110 is, for example, a light-shielding member formed of a metal or resin film or the like, as in the above-described black matrix 25.

Since the guide member 110 is present between the sealing substrate 23 and the element substrate 20, more specifically, is present in the region of the adhesive layer 26 between the color filters 24 and the protective layer 22, light emitted from the light-emitting element 21 is guided in the main light emission direction. That is, the light emitted from the light-emitting element 21 and oriented in the direction of the inclination with respect to the element substrate 20 is also reflected from the surface of the guide member 110, and is consequently oriented in the main light emission direction, that is, in the direction perpendicular to the element substrate 20, thereby preventing mixture into the other adjacent pixel regions.

Here, in the example illustrated in the drawing, the cross-section of the guide member 110 has a tapered shape opened toward the side of the element substrate 20. Thus, much light emitted from the light-emitting element 21 can be collected, and thus can be guided to a predetermined region (pixel region) of the sealing substrate 23. The region of the guide member 110 on the side of the sealing substrate 23 may be, for example, the same region as the above-described black matrix 25. Since the guide member 110 is a light-shielding member, as described above, the guide member 110 guides emitted light and also functions as the black matrix on the side of the sealing substrate 23. Alternatively, a separate black matrix may be formed aside from the guide member 110.

FIG. 6 is a diagram illustrating an example of the planar configuration of the display region illustrated in FIG. 5. Referring to FIG. 6, the guide member 110 is disposed to surround the color filters 24 of the respective colors, that is, the pixel regions of the respective colors. Due to this disposition, mixture of the light from the other adjacent pixel regions can be prevented in each entire pixel region. In the present embodiment, it is not necessary for the guide member 110 to surround the entire respective pixel regions. For example, in the case of a stripe type pixel disposition, as in the example illustrated in the drawing, the guide member 110 may be disposed only on the long sides of the respective pixel regions and the normal black matrix maybe disposed on the short sides. This is because the gap between the pixels on the long sides is narrow and an influence of the mixture of the emitted light is considerable.

2-2. Method of Manufacturing Display Device

FIG. 7 is a diagram illustrating states of the display device in respective processes of a method of manufacturing the display device according to the first embodiment of the present disclosure. Referring to FIG. 7, the guide members 110 are first formed on the sealing substrate 23. The guide members 110 can be formed, for example, by applying a material to the sealing substrate 23 and then patterning the material by photolithography. When separate black matrixes are formed aside from the guide member 110, the black matrixes can be formed before the guide members 110 are formed. The black matrixes can also be formed, for example, by applying a material to the sealing substrate 23 and then patterning the material by photolithography. It is apparent to those skilled in the art that the guide members and the black matrixes described as being formed by application in this specification can also be formed by another known process such as a chemical vapor deposition (CVD) or a sputtering method. The color filters can be generally formed by printing rather than application.

Next, the color filters 24 of the respective colors are formed in the regions surrounded by the guide member 110 (as described above, the entire pixel regions may not necessarily be surrounded). The color filters 24 can be formed by, for example, an ink-jet method. Since the guide member 110 is thicker than the color filter 24, the guide member 110 protrudes between the color filters 24 at this time.

On the other hand, the element substrate 20 on which the light-emitting elements 21 and the protective layer 22 are formed is separately prepared, and the two substrates (including members formed on the substrates) are bonded via the adhesive layer 26. At this time, the guide members 110 protruding between the color filters 24 penetrate the adhesive layer 26 and come into contact with the protective layer 22. Thereafter, by hardening the adhesive layer 26, the organic EL display 100 is completed. In the example illustrated in the drawing, the adhesive layer 26 is applied to the side of the element substrate 20, but the adhesive layer 26 may be applied to the side of the sealing substrate 23.

2-3. Application to Electronic Apparatus

Next, the configuration of an electronic apparatus including the display device according to the first embodiment of the present disclosure will be described with reference to FIG. 8. FIG. 8 is a schematic block diagram illustrating the configuration of the electronic apparatus according to the first embodiment of the present disclosure.

Referring to FIG. 8, an electronic apparatus 1000 includes an organic EL display 100, a control circuit 500, an operation unit 600, a storage unit 700, and a communication unit 800. The electronic apparatus 1000 is any apparatus that includes the organic EL display 100, such as a television, a mobile phone (smartphone), a digital camera, or a personal computer, as a display unit.

The control circuit 500 includes, for example, a central processing unit (CPU), a random access memory (RAM), and a read-only memory (ROM) and controls each unit of the electronic apparatus 1000. The organic EL display 100 is also controlled by the control circuit 500.

The operation unit 600 includes, for example, a touch pad, a button, a keyboard, or a mouse and receives a user's input operation on the electronic apparatus 1000. The control circuit 500 controls the electronic apparatus 1000 in response to an input operation acquired by the operation unit 600.

The storage unit 700 includes, for example, a semiconductor memory, a magnetic disk, or an optical disc and stores various kinds of data necessary for the electronic apparatus 1000 to function. A program stored in the storage unit 700 may be read or executed so that the control circuit 500 may operate.

The communication unit 800 is additionally provided. The communication unit 800 is a communication interface connected to a wired or wireless network 900 and includes, for example, a modem, a port, or an antenna. The control circuit 500 receives data from the network 900 and transmits data to the network 900 via the communication unit 800.

The present embodiment includes not only the above-described organic EL display 100 but also the electronic apparatus 1000.

2-4. Modification Examples

Modification examples of the first embodiment of the present disclosure described above will be described with reference to FIGS. 9 to 14. In application to the manufacturing method or the electronic apparatus, the configuration of the present embodiment described above can also be applied to each modification example.

FIG. 9 is a diagram illustrating an example of an organic EL display 102 that includes guide members 112 having a straight cross-sectional shape rather than the tapered shape. A planar region of the guide member 112 is substantially the same as the planar region from a sealing substrate 23 to a protective layer 22. In this case, in comparison to the example of FIG. 5, the collected emitted light is slightly less. However, since the cross-sectional shape of the guide member 112 is simple, processing can be easily performed at the time of formation of the guide member 112.

FIG. 10 is a diagram illustrating an example of an organic EL display 104 that includes guide members 114 of which a cross-section has a tapered shape opened toward the side of the sealing substrate 23. The cross-section of the guide member 114 has a tapered shape in a reverse direction to the direction of the guide member 110 illustrated in the example of FIG. 5. In this case, the collected emitted light is less. However, since light reflected from the surface of the guide member 114 is dispersed to a larger range, a viewable angle range of an image to be displayed is enlarged. That is, the organic EL display 104 has greater directivity.

FIGS. 11A to 11C are diagrams illustrating examples of an organic EL display 106 in which an element substrate 20 and a sealing substrate 23 are bonded without an adhesive layer 26. In the case of the example illustrated in FIG. 11A, transparent insulation films 27 are formed between the guide members 110, that is, in spaces between color filters 24 and a protective layer 22, and a surface formed by the guide members 110 and the transparent insulation films 27 is bonded directly to the protective layer 22. Since no adhesive layer 26 is interposed, for example, it is possible to prevent an influence of a process of hardening the adhesive layer 26 accompanied by heating or irradiation of ultraviolet rays to other members. Further, the guide member 110 may be substituted with the guide member 112 illustrated in the foregoing example of FIG. 9 or the guide member 114 illustrated in the foregoing example of FIG. 10.

FIG. 11B is a diagram illustrating states of respective processes of a method of manufacturing the organic EL display illustrated in FIG. 11A. Referring to FIG. 11B, the guide members 110 are formed on the sealing substrate 23. After the color filters 24 of respective colors are formed in regions surrounded by the guide members 110 (since this process is the same as that of the manufacturing method illustrated in FIG. 7, the detailed description thereof will be omitted), transparent insulation films 27 are formed between the guide members 110. Then, a surface formed by the guide members 110 and the transparent insulation films 27 is smoothed by polishing the surface through chemical mechanical polishing (CMP), and then is bonded directly to the surface of the protective layer 22 of the element substrate 20 facing the surface formed by the guide members 110 and the transparent insulation films 27. In the direct bonding, for example, surface activated bonding is used. In the surface activated bonding, after the respective surfaces are activated by plasma etching, wet etching, or ion-beam etching, the surfaces are bonded to each other.

FIG. 11C is a diagram illustrating a schematic diagram illustrating the configuration of the organic EL display 106 illustrated in FIG. 11A. In this example, the transparent insulation films 27 are formed between the guide members 110 and cover the cross-sections of the guide members 110 located on the side of the element substrate 20. Accordingly, the surface on the side of the sealing substrate 23 facing the protective layer 22 of the element substrate 20 is formed by the transparent insulation films 27. For example, this configuration is effective when surface activation for direct bonding is difficult due to exposure of the edges of the guide members 110.

FIG. 12 is a diagram illustrating an example of an organic EL display 108 in which guide members 110 penetrate into an adhesive layer 26. In the organic EL display 108, the guide members 110 do not penetrate the adhesive layer 26 and do not come into contact with the protective layer 22. Accordingly, when the element substrate 20 and the sealing substrate 23 are bonded to each other, the gap between the element substrate 20 and the sealing substrate 23 can be set irrespective of the thicknesses of the guide members 110. For example, even when the thicknesses of the guide members 110 are not uniform, the gap between the substrates can be uniformly maintained. Further, since the surface of the protective layer 22 or the light-emitting elements 21 does not come into contact with the guide members 110, the surface may not be smoothed or, for example, the adhesive layer 26 may be applied even in the uneven state.

FIG. 13 is a diagram illustrating an example of an organic EL display 120 in which guide members 112 having a straight cross-sectional shape rather than the tapered shape penetrate into an adhesive layer 26. In the organic EL display 120, the guide members 112 do not penetrate the adhesive layer 26 and do not come into contact with the protective layer 22. As apparent from the drawing, this modification example is combined with the foregoing example illustrated in FIG. 9 and the foregoing example illustrated in FIG. 12. Accordingly, the same advantages as those of the examples can be obtained.

FIG. 14 is a diagram illustrating an example of an organic EL display 122 in which guide members 114 of which a cross-section has a tapered shape opened toward the side of the sealing substrate 23 penetrate into an adhesive layer 26. In the organic EL display 122, the guide members 114 do not penetrate the adhesive layer 26 and do not come into contact with a protective layer 22. As apparent from the drawing, this modification example is combined with the foregoing example illustrated in FIG. 10 and the foregoing example illustrated in FIG. 12. Accordingly, the same advantages as those of the examples can be obtained.

The modification examples of the present embodiment have been described. In the foregoing description, the examples of the organic EL displays all including the color filters 24 have been described. However, the color filters 24 may not necessarily be formed. As described above, when the light-emitting elements 21 emit light with respective colors of the pixels, the color filters 24 are formed to improve color purity in some cases, but may not be formed in other cases. Further, the color filters 24 are formed only for some of the colors of the pixels in some cases. In the present embodiment, since the guide members 110 are formed on the sealing substrate 23, presence or absence of the color filters 24 does not affect the structure of the guide members 110.

3. Second Embodiment

Next, a second embodiment of the present disclosure will be described. Since a configuration in application to an electronic apparatus is the same as the foregoing configuration of the first embodiment, the repeated description thereof will be omitted.

3-1. Configuration of Display Device

FIG. 15 is a diagram illustrating an example of a cross-sectional configuration of a display region in a display device according to the second embodiment of the present disclosure. The display device according to the present embodiment is an organic EL display 200.

In the display region of the organic EL display 200, an element substrate 20 and a sealing substrate 23 are adhered via an adhesive layer 26. A plurality of light-emitting elements 21 are disposed on the element substrate 20 and the light-emitting elements 21 are covered with a protective layer 22. On the other hand, on the side of the sealing substrate 23, color filters 24 (a red color filter 24R, a green color filter 24G, and a blue color filter 24B) are disposed.

Further, a guide member 210 is formed in a boundary of the color filters 24 of respective colors. The guide member 210 comes into contact with the surface of the color filters 24 on the side of the element substrate 20 on one side and penetrates the adhesive layer 26 and comes into contact with the protective layer 22 on the element substrate 20 on the other side. That is, the guide member 210 is formed so as to be exactly interposed between the color filters 24 and the protective layer 22. The guide member 210 is, for example, a light-shielding member formed of a metal or resin film or the like, as in the above-described black matrix 25.

The guide members 210 according to the present embodiment are not formed between the color filters 24 of respective colors. Accordingly, the mixture of light between the pixels in portions of the color filters 24 is not prevented by the guide member 210. However, since light emitted from the light-emitting elements 21 is guided in a main light emission direction by the guide members 210 in the regions between the protective layer 22 and the color filters 24, the mixture of the light between the pixels can be sufficiently prevented in the entire organic EL display 200. In this embodiment, the color filters 24 are formed earlier than the guide members 210, as will be described below, and it is possible to obtain the advantage of improving the degree of freedom of a method of forming the color filters 24.

Here, in the example illustrated in the drawing, the cross-section of the guide member 210 has a tapered shape opened toward the side of the element substrate 20. Thus, much light emitted from the light-emitting element 21 is collected, and thus can be guided to a predetermined region (pixel region) of the sealing substrate 23. The region of the guide member 210 on the side of the sealing substrate 23 may be, for example, the same region as that of the above-described black matrix 25. In the present embodiment, since the guide member 210 is also a light-shielding member formed in a boundary between the pixel regions, the guide member 210 also functions as a black matrix. However, for example, to further enhance the function of the black matrix, the same black matrix as the black matrix illustrated in the example of FIG. 4 may be separately formed on the side of the sealing substrate 23 of the color filter 24.

3-2. Method of Manufacturing Display Device

FIG. 16 is a diagram illustrating states of the display device in respective processes of a first method of manufacturing the display device according to the second embodiment of the present disclosure. Referring to FIG. 16, the color filters 24 are first formed on the sealing substrate 23. The color filters 24 can be formed, for example, by applying color resists of respective colors to the sealing substrate 23 and then patterning the color resists by photolithography. Alternatively, the color filters 24 may be formed by an ink-jet method. Next, the guide members 210 are formed in the boundaries between the color filters 24 of the respective colors. For example, the guide members 210 can be formed by applying a material to the color filters 24 or a protective layer to be described below and then patterning the material by photolithography.

Here, when there is a concern that the color filters 24 may be damaged in the process of forming the guide members 210, a protective layer (not illustrated) may be formed on the surfaces of the color filters 24 and the guide members 210 may be formed on the surface of the color filters 24. Further, the color filters 24 of the respective colors are formed with different thicknesses due to spectroscopic characteristics in some cases, and thus step differences may occur in the boundaries even in the forming process. When the step differences of the boundaries between the color filters 24 are large, a protective layer (not illustrated) may also be formed on the surfaces of the color filters 24, the surface of the protective layer is smoothed, for example, by polishing the surface of the protective layer by CMP, and then the guide members 210 may be formed. Alternatively, when the material of the guide members 210 is applied to the surfaces in which there are step differences, the surfaces may be smoothed, for example, by polishing the surfaces by CMP. The protective layer is formed by application or a process such as CVD using, for example, an inorganic amorphous-based insulation material (silicon dioxide, silicon nitride, silicon oxynitride, silicon carbide, silicon nitride carbide, or the like).

Next, the element substrate 20 on which the light-emitting elements 21 and the protective layer 22 are formed is separately prepared, and the two substrates (including members formed on the substrates) are adhered via the adhesive layer 26. At this time, the guide members 210 protruding from the surfaces of the color filters 24 penetrate the adhesive layer 26 and come into contact with the protective layer 22. Thereafter, by hardening the adhesive layer 26, the organic EL display 200 is completed. In the example illustrated in the drawing, the adhesive layer 26 is applied to the side of the element substrate 20, but the adhesive layer 26 may be applied to the side of the sealing substrate 23.

FIG. 17 is a diagram illustrating states of the display device in respective processes of a second method of manufacturing the display device according to the second embodiment of the present disclosure. Referring to FIG. 17, first, the guide members 210 are formed on the light-emitting elements 21 and the protective layer 22 formed on the element substrate 20. For example, the guide members 210 can be formed by applying a material to the protective layer 22 and then patterning the material by photolithography. As in the example of FIG. 16, when unevenness is great on the surface of the protective layer 22, the surface of the protective layer 22 may be smoothed, for example, by polishing the surface by CMP or may be smoothed, for example, by polishing the surface by CMP at the time of the application of the material of the guide members 210.

Next, the sealing substrate 23 on which the color filters 24 of the respective colors are formed is separately prepared, and the two substrates (including members formed on the substrates) are adhered via the adhesive layer 26. At this time, the guide members 210 protruding from the surface of the protective layer 22 penetrate the adhesive layer 26 and come into contact with the boundaries of the color filters 24. When step differences of the boundaries between the color filters 24 are large, it is preferable that a protective layer (not illustrated) be formed on the surfaces of the color filters 24, the surface of the protective layer be smoothed, and then the guide members 210 be brought into contact.

Thereafter, the organic EL display 200 is completed by hardening the adhesive layer 26. In the example illustrated in the drawing, the adhesive layer 26 is applied to the side of the sealing substrate 23, but the adhesive layer 26 may be applied to the side of the element substrate 20.

3-3. Modification Examples

Modification examples of the second embodiment of the present disclosure described above will be described with reference to FIG. 18. In the manufacturing method, the configuration of the present embodiment described above can also be applied to each modification example.

FIG. 18 is a diagram illustrating an example of an organic EL display 202 in which guide members 210 penetrate into an adhesive layer 26. In the organic EL display 202, the guide members 210 do not penetrate the adhesive layer 26 and do not come into contact with the protective layer 22. Accordingly, when the element substrate 20 and the sealing substrate 23 are bonded to each other, the gap between the element substrate 20 and the sealing substrate 23 can be set irrespective of the thicknesses of the guide members 210. For example, even when the thicknesses of the guide members 210 are not uniform, the gap between the substrates can be uniformly maintained. Further, since the surface of the protective layer 22 or the light-emitting elements 21 does not come into contact with the guide members 210, the surface may not be smoothed or the adhesive layer 26 may be applied even in the uneven state.

Although not illustrated in the drawing, in the present embodiment, the modification example in which the guide member has the straight cross-sectional shape rather than the tapered shape and the modification example in which the cross-section of the guide member has the tapered shape opened toward the side of the sealing substrate 23 can be applied to both of the foregoing example of FIG. 15 and the foregoing example of FIG. 18, as in the foregoing first embodiment. A modification example in which the element substrate 20 and the sealing substrate 23 are bonded without intervention of the adhesive layer 26 can also be applied to the example of FIG. 15.

4. Third Embodiment

Next, a third embodiment of the present disclosure will be described. Since a configuration in application to an electronic apparatus is the same as the foregoing configuration of the first embodiment, repeated description thereof will be omitted.

4-1. Configuration of Display Device

FIG. 19 is a diagram illustrating an example of a cross-sectional configuration of a display region in a display device according to the third embodiment of the present disclosure. The display device according to the present embodiment is an organic EL display 300.

In the display region of the organic EL display 300, an element substrate 20 and a sealing substrate 320 are adhered via an adhesive layer 26. A plurality of light-emitting elements 21 are disposed on the element substrate 20 and the light-emitting elements 21 are covered with a protective layer 22. On the other hand, on the side of the sealing substrate 320, color filters 24 (a red color filter 24R, a green color filter 24G, and a blue color filter 24B) are disposed.

Further, a guide member 310 is formed in a boundary of the color filters 24 of respective colors. The guide member 310 penetrates into a groove 320g penetrating the color filters 24 and formed in the sealing substrate 320 on one side and penetrates the adhesive layer 26 and comes into contact with the protective layer 22 on the element substrate 20 on the other side. That is, the guide member 310 is configured to be exactly interposed between the color filters 24 and the protective layer 22. The guide member 310 is, for example, a light-shielding member formed of a metal or resin film or the like, as in the above-described black matrix 25.

Here, the sealing substrate 320 is a substrate formed of glass or the like and sealing a stack structure formed in the display region, as in the foregoing sealing substrate 23, but differs from the sealing substrate 23 in that the groove 320g into which the guide member 310 penetrates is formed by processing.

The guide member 310 according to the present embodiment penetrates the color filters 24 of the respective colors from the adhesive layer 26 and is formed up to the inside of the sealing substrate 320. Accordingly, since light emitted from the light-emitting element 21 is guided in a main light emission direction in a region larger than the guide member 110 of the foregoing first embodiment, the mixture of the light between the pixels can be prevented more effectively. However, a process of forming the grooves 320g in the sealing substrate 320 formed of glass or the like is not necessarily easy. Accordingly, the present embodiment and other embodiments such as the foregoing first and second embodiments can be distributed appropriately in consideration of the obtainable advantages and the degree of difficulty of the process.

Here, in the example illustrated in the drawing, the cross-section of the guide member 310 has a tapered shape opened toward the side of the element substrate 20. Thus, much light emitted from the light-emitting element 21 can be collected, and thus can be guided to a predetermined region (pixel region) of the sealing substrate 320. Further, in the example illustrated in the drawing, the tapered shape is continuous up to both ends of the guide member 310.

However, for example, the cross-sectional shape of the guide member 310 may be changed from the tapered shape to a straight rectangular shape from a portion penetrating into the sealing substrate 320. Thus, the cross-section of the groove 320g of the sealing substrate 320 may have a rectangular shape, and thus the groove 320g can be processed easily to some extent. The region of the guide member 310 on the side of the sealing substrate 320 may be, for example, the same region as the above-described black matrix 25. Since the guide member 310 is a light-shielding member, as described above, the guide member 310 guides emitted light and also functions as the black matrix on the side of the sealing substrate 320.

4-2. Method of Manufacturing Display Device

FIG. 20 is a diagram illustrating states of the display device in respective processes of a method of manufacturing the display device according to the third embodiment of the present disclosure. Referring to FIG. 20, the grooves 320g are first formed in the sealing substrate 320. The grooves 320g are formed by, for example, etching or a mechanical process. Next, the guide members 310 are formed in the regions corresponding to the grooves 320g on the sealing substrate 320. The guide members 310 can be formed, for example, by applying a material to the sealing substrate 320 and then patterning the material by photolithography. At this time, when large step differences occur on the surface of the applied material due to the fact that the grooves 320g are formed, the surface of the material may be smoothed by polishing the surface by CMP.

Next, the color filters 24 of the respective colors are formed in the regions surrounded by the guide members 310 (as in the first embodiment, the entire regions may not necessarily be surrounded and black matrixes can be formed in the boundaries between the pixel regions in which the guide members 310 are not formed). The color filters 24 can be formed by, for example, an ink-jet method. Since the guide member 310 is thicker than the color filter 24, the guide member 310 protrudes between the color filters 24 at this time.

Next, the element substrate 20 on which the light-emitting elements 21 and the protective layer 22 are formed is separately prepared, and the two substrates (including members formed on the substrates) are bonded via the adhesive layer 26. At this time, the guide members 310 protruding between the color filters 24 penetrate the adhesive layer 26 and come into contact with the protective layer 22. Thereafter, by hardening the adhesive layer 26, the organic EL display 300 is completed. In the example illustrated in the drawing, the adhesive layer 26 is applied to the side of the element substrate 20, but the adhesive layer 26 may be applied to the side of the sealing substrate 320.

4-3. Modification Examples

Modification examples of the third embodiment of the present disclosure described above will be described with reference to FIG. 21. In the manufacturing method, the configuration of the present embodiment described above can also be applied to each modification example.

FIG. 21 is a diagram illustrating an example of an organic EL display 302 in which guide members 310 penetrate into an adhesive layer 26. In the organic EL display 302, the guide members 310 do not penetrate the adhesive layer 26 and do not come into contact with the protective layer 22. Accordingly, when the element substrate 20 and the sealing substrate 320 are bonded to each other, the gap between the element substrate 20 and the sealing substrate 320 can be set irrespective of the thicknesses of the guide members 310. For example, even when the thicknesses of the guide members 310 are not uniform, the gap between the substrates can be uniformly maintained. Further, since the surface of the protective layer 22 or the light-emitting elements 21 does not come into contact with the guide members 310, the surface may not be smoothed or, for example, the adhesive layer 26 may be applied even in the uneven state.

Although not illustrated in the drawing, in the present embodiment, the modification example in which the guide member has the straight cross-sectional shape rather than the tapered shape and the modification example in which the cross-section of the guide member has the tapered shape opened toward the side of the sealing substrate 320 can be applied to both of the foregoing example of FIG. 19 and the foregoing example of FIG. 21, as in the foregoing first embodiment. A modification example in which the element substrate 20 and the sealing substrate 320 are bonded without intervention of the adhesive layer 26 can also be applied to the example of FIG. 19.

5. Supplement

The foregoing embodiments have been described as examples in which the display device is an organic EL display, but embodiments of the present disclosure are not limited to these examples. Embodiments of the present disclosure can be applied to various display devices such as an inorganic EL display, as long as the display devices include light-emitting elements.

Although not illustrated, an insulation film formed of silicon oxide, silicon oxynitride, silicon nitride, silicon carbide, silicon nitride carbide, or the like may be formed so as to surround the black matrix. For example, this insulation film may be formed between the black matrixes and the color filters or may be formed between the black matrix and the insulation film.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1)

A display device including:

a plurality of light-emitting elements that are disposed on a first substrate; and a guide member that is disposed in a boundary between pixel regions corresponding to the light-emitting elements and guides light emitted from each of the light-emitting elements between the first substrate and a second substrate facing the first substrate in a main light emission direction of each of the light-emitting elements.

(2)

The display device according to (1), further including:

a color filter that is disposed in one of the pixel regions on the second substrate, wherein the guide member guides the emitted light at least between the color filter and the first substrate.

(3)

The display device according to (2), wherein the guide member penetrates the color filter and comes into contact with a surface of the second substrate.

(4)
The display device according to (2), wherein the guide member comes into contact with a surface of the color filter on a side of the first substrate.

(5)
The display device according to (2), wherein the guide member penetrates the color filter into the second substrate.

(6)
The display device according to any one of (1) to (5), further including:
a protective layer of the plurality of light-emitting elements that is formed on the first substrate,
wherein the guide member comes into contact with the protective layer.

(7)
The display device according to (6), further including:
an adhesive layer that is interposed between the protective layer and the second substrate,
wherein the guide member penetrates the adhesive layer.

(8)
The display device according to any one of (1) to (5), further including:
a protective layer of the plurality of light-emitting elements that is formed on the first substrate; and
an adhesive layer that is interposed between the protective layer and the second substrate,
wherein the guide member penetrates into the adhesive layer.

(9)
The display device according to any one of (1) to (8), wherein a cross-section of the guide member has a tapered shape opened toward a side of the first substrate.

(10)
The display device according to any one of (1) to (8), wherein a cross-section of the guide member has a tapered shape opened toward a side of the second substrate.

(11)
A method of manufacturing a display device, including:
forming a guide member, which is disposed in a boundary between pixel regions corresponding to a plurality of light-emitting elements disposed on a first substrate and guides light emitted from each of the light-emitting elements between the first substrate and a second substrate facing the first substrate in a main light emission direction of each of the light-emitting elements, on the first substrate or the second substrate; and
bonding the first substrate with the second substrate.

(12)
The method of manufacturing a display device according to (11), further including: disposing a color filter in one of the pixel regions on the second substrate.

(13)
The method of manufacturing a display device according to (12),
wherein the guide member is formed on the second substrate,
wherein the step of forming the guide member is performed before the step of disposing the color filter.

(14)
The method of manufacturing a display device according to (13), further including: forming a groove in which the guide member penetrates into the second substrate.

(15)
The method of manufacturing a display device according to (12),
wherein the guide member is formed on the second substrate, and
wherein the step of forming the guide member is performed after the step of disposing the color filter.

(16)
The method of manufacturing a display device according to any one of (11) to (15),
wherein the guide member is formed on the second substrate, and
wherein, in the step of bonding the first substrate with the second substrate, the guide member comes into contact with a protective layer of the plurality of light-emitting elements formed on the first substrate.

(17)
The method of manufacturing a display device according to (16), wherein, in the step of bonding the first substrate with the second substrate, the first substrate and the second substrate are bonded via an adhesive layer and the guide member penetrates the adhesive layer.

(18)
The method of manufacturing a display device according to any one of (11) to (15),
wherein, in the step of bonding the first substrate with the second substrate, the first substrate and the second substrate are bonded via an adhesive layer and the guide member partially penetrates into the adhesive layer.

(19)
An electronic apparatus including:
a display device configured to include a plurality of light-emitting elements that are disposed on a first substrate and a guide member that is disposed in a boundary between pixel regions corresponding to the light-emitting elements and guides light emitted from each of the light-emitting elements between the first substrate and a second substrate facing the first substrate in a main light emission direction of each of the light-emitting elements.

REFERENCE SIGNS LIST 20 element substrate
21 light-emitting element
22 protective layer
23, 320 sealing substrate
24 color filter
26 adhesive layer
100, 200, 300 organic EL display
110, 210, 310 guide member
320g groove
1000 electronic apparatus

The invention claimed is:
1. A display device comprising:
a plurality of light-emitting elements that are disposed on a first substrate;
a guide member that is disposed in a boundary between pixel regions corresponding to the plurality of light-emitting elements and is configured to guide light emitted from each of the plurality of light-emitting elements between the first substrate and a second substrate facing the first substrate in a main light emission direction of each of the plurality of light-emitting elements; and
a color filter that is disposed in one of the pixel regions on the second substrate and surrounded by the guide member,
wherein the guide member is configured to guide the light that is emitted at least between the color filter and the first substrate, and
wherein the guide member penetrates the color filter and the second substrate.

2. A display device comprising:
a plurality of light-emitting elements that are disposed on a first substrate;
a guide member that is disposed in a boundary between pixel regions corresponding to the plurality of light-emitting elements and is configured to guide light emitted from each of the plurality of light-emitting elements between the first substrate and a second substrate facing the first substrate in a main light emission direction of each of the plurality of light-emitting elements;
a color filter that is disposed in one of the pixel regions on the second substrate and surrounded by the guide member; and
a protective layer of the plurality of light-emitting elements that is formed on the first substrate,
wherein the guide member comes into contact with the protective layer,
wherein the guide member is configured to guide the light that is emitted at least between the color filter and the first substrate, and
wherein the guide member contacts a surface of the color filter that is facing the first substrate.

3. The display device according to claim 2, wherein the guide member penetrates the color filter and contacts a surface of the second substrate.

4. The display device according to claim 2, further comprising:
an adhesive layer that is interposed between the protective layer and the second substrate,
wherein the guide member penetrates the adhesive layer.

5. A display device comprising:
a plurality of light-emitting elements that are disposed on a first substrate;
a guide member that is disposed in a boundary between pixel regions corresponding to the plurality of light-emitting elements and is configured to guide light emitted from each of the plurality of light-emitting elements between the first substrate and a second substrate facing the first substrate in a main light emission direction of each of the plurality of light-emitting elements;
a color filter that is disposed in one of the pixel regions on the second substrate and surrounded by the guide member;
a protective layer of the plurality of light-emitting elements that is formed on the first substrate; and
an adhesive layer that is interposed between the protective layer and the second substrate,
wherein the guide member penetrates into the adhesive layer,
wherein the guide member is configured to guide the light that is emitted at least between the color filter and the first substrate, and
wherein the guide member contacts a surface of the color filter that is facing the first substrate.

6. The display device according to claim 5, wherein the guide member penetrates the color filter and contacts a surface of the second substrate.

7. A display device comprising:
a plurality of light-emitting elements that are disposed on a first substrate;
a guide member that is disposed in a boundary between pixel regions corresponding to the plurality of light-emitting elements and is configured to guide light emitted from each of the plurality of light-emitting elements between the first substrate and a second substrate facing the first substrate in a main light emission direction of each of the plurality of light-emitting elements; and
a color filter that is disposed in one of the pixel regions on the second substrate and surrounded by the guide member,
wherein the guide member is configured to guide the light that is emitted at least between the color filter and the first substrate,
wherein a full cross-section of the guide member has a tapered shape opened toward a side of the first substrate.

8. The display device according to claim 7, wherein the guide member penetrates the color filter and contacts a surface of the second substrate.

9. The display device according to claim 7, wherein the guide member contacts a surface of the color filter on a side of the first substrate.

10. A display device comprising:
a plurality of light-emitting elements that are disposed on a first substrate;
a guide member that is disposed in a boundary between pixel regions corresponding to the plurality of light-emitting elements and is configured to guide light emitted from each of the plurality of light-emitting elements between the first substrate and a second substrate facing the first substrate in a main light emission direction of each of the plurality of light-emitting elements; and
a color filter that is disposed in one of the pixel regions on the second substrate and surrounded by the guide member,
wherein the guide member is configured to guide the light that is emitted at least between the color filter and the first substrate,
wherein a cross-section of the guide member has a tapered shape opened toward a side of the second substrate, and
wherein the guide member contacts a surface of the color filter that is facing the first substrate.

11. The display device according to claim 10, wherein the guide member penetrates the color filter and contacts a surface of the second substrate.

* * * * *